United States Patent
Yu et al.

(10) Patent No.: US 7,045,815 B2
(45) Date of Patent: May 16, 2006

(54) SEMICONDUCTOR STRUCTURE EXHIBITING REDUCED LEAKAGE CURRENT AND METHOD OF FABRICATING SAME

(75) Inventors: Zhiyi Yu, Gilbert, AZ (US); Ravindranath Droopad, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 83 days.

(21) Appl. No.: 10/207,210

(22) Filed: Jul. 30, 2002

(65) Prior Publication Data

US 2002/0187600 A1    Dec. 12, 2002

Related U.S. Application Data

(63) Continuation of application No. 09/824,259, filed on Apr. 2, 2001, now abandoned.

(51) Int. Cl.
    *H01L 29/12* (2006.01)

(52) U.S. Cl. .................. 257/43; 257/632; 257/635

(58) Field of Classification Search ............ 438/481, 438/785, 778, 761, 763, 787; 257/43, 632, 257/635
See application file for complete search history.

(56) References Cited

U.S. PATENT DOCUMENTS

| | | |
|---|---|---|
| 3,617,951 A | 11/1971 | Anderson |
| 3,670,213 A | 6/1972 | Nakawaga et al. |
| 3,758,199 A | 9/1973 | Thaxter |
| 3,766,370 A | 10/1973 | Walther |
| 3,802,967 A | 4/1974 | Ladany et al. |
| 3,818,451 A | 6/1974 | Coleman |
| 3,914,137 A | 10/1975 | Huffman et al. |
| 3,935,031 A | 1/1976 | Adler |
| 4,006,989 A | 2/1977 | Andringa |
| 4,084,130 A | 4/1978 | Holton |
| 4,120,588 A | 10/1978 | Chaum |
| 4,146,297 A | 3/1979 | Alferness et al. |
| 4,174,422 A | 11/1979 | Matthews et al. |
| 4,174,504 A | 11/1979 | Chenausky et al. |
| 4,177,094 A | 12/1979 | Kroon |
| 4,242,595 A | 12/1980 | Lehovec |
| 4,284,329 A | 8/1981 | Smith et al. |

(Continued)

FOREIGN PATENT DOCUMENTS

DE    196 07 107    8/1997

(Continued)

OTHER PUBLICATIONS

Charles Kittel; "Introduction to Solid State Physics"; John Wiley & Sons, Inc. Fifth Edition; p. 415.

(Continued)

*Primary Examiner*—Caridad Everhart
(74) *Attorney, Agent, or Firm*—Oblon, Spivak, McClelland, Maier & Neustadt, P.C.

(57) ABSTRACT

A semiconductor structure exhibiting reduced leakage current is formed of a monocrystalline substrate (101) and a strained-layer heterostructure (105). The strained-layer heterostructure has a first layer (102) formed of a first monocrystalline oxide material having a first lattice constant and a second layer (104) formed of a second monocrystalline oxide material overlying the first layer and having a second lattice constant. The second lattice constant is different from the first lattice constant. The second layer creates strain within the oxide material layers, at the interface between the first and second oxide material layers of the heterostructure, and at the interface of the substrate and the first layer, which changes the energy band offset at the interface of the substrate and the first layer.

11 Claims, 1 Drawing Sheet

U.S. PATENT DOCUMENTS

| | | |
|---|---|---|
| 4,289,920 A | 9/1981 | Hovel |
| 4,297,656 A | 10/1981 | Pan |
| 4,298,247 A | 11/1981 | Michelet et al. |
| 4,378,259 A | 3/1983 | Hasegawa et al. |
| 4,392,297 A | 7/1983 | Little |
| 4,398,342 A | 8/1983 | Pitt et al. |
| 4,404,265 A | 9/1983 | Manasevit |
| 4,424,589 A | 1/1984 | Thomas et al. |
| 4,439,014 A | 3/1984 | Stacy et al. |
| 4,442,590 A | 4/1984 | Stockton et al. |
| 4,447,116 A | 5/1984 | King et al. |
| 4,452,720 A | 6/1984 | Harada et al. |
| 4,459,325 A | 7/1984 | Nozawa et al. |
| 4,482,422 A | 11/1984 | McGinn et al. |
| 4,482,906 A | 11/1984 | Hovel et al. |
| 4,484,332 A | 11/1984 | Hawrylo |
| 4,503,540 A | 3/1985 | Nakashima et al. |
| 4,523,211 A | 6/1985 | Morimoto et al. |
| 4,525,871 A | 6/1985 | Foyt et al. |
| 4,594,000 A | 6/1986 | Falk et al. |
| 4,626,878 A | 12/1986 | Kuwano et al. |
| 4,629,821 A | 12/1986 | Bronstein-Bonte et al. |
| 4,661,176 A | 4/1987 | Manasevit |
| 4,667,088 A | 5/1987 | Kramer |
| 4,667,212 A | 5/1987 | Nakamura |
| 4,681,982 A | 7/1987 | Yoshida |
| 4,695,120 A | 9/1987 | Holder |
| 4,723,321 A | 2/1988 | Saleh |
| 4,748,485 A | 5/1988 | Vasudev |
| 4,756,007 A | 7/1988 | Qureshi et al. |
| 4,772,929 A | 9/1988 | Manchester et al. |
| 4,773,063 A | 9/1988 | Hunsperger et al. |
| 4,774,205 A | 9/1988 | Choi et al. |
| 4,777,613 A | 10/1988 | Shahan et al. |
| 4,793,872 A | 12/1988 | Meunier et al. |
| 4,801,184 A | 1/1989 | Revelli |
| 4,802,182 A | 1/1989 | Thornton et al. |
| 4,804,866 A | 2/1989 | Akiyama |
| 4,815,084 A | 3/1989 | Scifres et al. |
| 4,841,775 A | 6/1989 | Ikeda et al. |
| 4,843,609 A | 6/1989 | Ohya et al. |
| 4,845,044 A | 7/1989 | Ariyoshi et al. |
| 4,846,926 A | 7/1989 | Kay et al. |
| 4,855,249 A | 8/1989 | Akasaki et al. |
| 4,866,489 A | 9/1989 | Yokogawa et al. |
| 4,868,376 A | 9/1989 | Lessin et al. |
| 4,872,046 A | 10/1989 | Morkoc et al. |
| 4,876,208 A | 10/1989 | Gustafson et al. |
| 4,876,218 A | 10/1989 | Pessa et al. |
| 4,876,219 A | 10/1989 | Eshita et al. |
| 4,882,300 A | 11/1989 | Inoue et al. |
| 4,885,376 A | 12/1989 | Verkade |
| 4,888,202 A | 12/1989 | Murakami et al. |
| 4,889,402 A | 12/1989 | Reinhart |
| 4,891,091 A | 1/1990 | Shastry |
| 4,896,194 A | 1/1990 | Suzuki |
| 4,901,133 A | 2/1990 | Curran et al. |
| 4,910,164 A | 3/1990 | Shichijo |
| 4,912,087 A | 3/1990 | Aslam et al. |
| 4,928,154 A | 5/1990 | Umeno et al. |
| 4,934,777 A | 6/1990 | Jou et al. |
| 4,952,420 A | 8/1990 | Walters |
| 4,959,702 A | 9/1990 | Moyer et al. |
| 4,963,508 A | 10/1990 | Umeno et al. |
| 4,963,949 A | 10/1990 | Wanlass et al. |
| 4,965,649 A | 10/1990 | Zanio et al. |
| 4,981,714 A | 1/1991 | Ohno et al. |
| 4,984,043 A | 1/1991 | Vinal |
| 4,999,842 A | 3/1991 | Huang et al. |
| 5,018,816 A | 5/1991 | Murray et al. |
| 5,028,563 A | 7/1991 | Feit et al. |
| 5,028,976 A | 7/1991 | Ozaki et al. |
| 5,051,790 A | 9/1991 | Hammer |
| 5,053,835 A | 10/1991 | Horikawa et al. |
| 5,055,445 A | 10/1991 | Belt et al. |
| 5,055,835 A | 10/1991 | Sutton |
| 5,057,694 A | 10/1991 | Idaka et al. |
| 5,060,031 A | 10/1991 | Abrokwah et al. |
| 5,063,081 A | 11/1991 | Cozzette et al. |
| 5,063,166 A | 11/1991 | Mooney et al. |
| 5,064,781 A | 11/1991 | Cambou et al. |
| 5,067,809 A | 11/1991 | Tsubota |
| 5,073,981 A | 12/1991 | Giles et al. |
| 5,075,743 A | 12/1991 | Behfar-Rad |
| 5,081,062 A | 1/1992 | Vasudev et al. |
| 5,081,519 A | 1/1992 | Nishimura et al. |
| 5,087,829 A | 2/1992 | Ishibashi et al. |
| 5,103,494 A | 4/1992 | Mozer |
| 5,116,461 A | 5/1992 | Lebby et al. |
| 5,119,448 A | 6/1992 | Schaefer et al. |
| 5,122,679 A | 6/1992 | Ishii et al. |
| 5,122,852 A | 6/1992 | Chan et al. |
| 5,127,067 A | 6/1992 | Delcoco et al. |
| 5,130,762 A | 7/1992 | Kulick |
| 5,132,648 A | 7/1992 | Trinh et al. |
| 5,140,387 A | 8/1992 | Okazaki et al. |
| 5,140,651 A | 8/1992 | Soref et al. |
| 5,141,894 A | 8/1992 | Bisaro et al. |
| 5,143,854 A | 9/1992 | Pirrung et al. |
| 5,144,409 A | 9/1992 | Ma |
| 5,148,504 A | 9/1992 | Levi et al. |
| 5,155,658 A | 10/1992 | Inam et al. |
| 5,159,413 A | 10/1992 | Calviello et al. |
| 5,163,118 A | 11/1992 | Lorenzo et al. |
| 5,166,761 A | 11/1992 | Olson et al. |
| 5,173,474 A | 12/1992 | Connell et al. |
| 5,173,835 A | 12/1992 | Cornett et al. |
| 5,181,085 A | 1/1993 | Moon et al. |
| 5,185,589 A | 2/1993 | Krishnaswamy et al. |
| 5,188,976 A | 2/1993 | Kume et al. |
| 5,191,625 A | 3/1993 | Gustavsson |
| 5,194,397 A | 3/1993 | Cook et al. |
| 5,194,917 A | 3/1993 | Regener |
| 5,198,269 A | 3/1993 | Swartz et al. |
| 5,208,182 A | 5/1993 | Narayan et al. |
| 5,210,763 A | 5/1993 | Lewis et al. |
| 5,216,359 A | 6/1993 | Makki et al. |
| 5,216,729 A | 6/1993 | Berger et al. |
| 5,221,367 A | 6/1993 | Chisholm et al. |
| 5,225,031 A * | 7/1993 | McKee et al. ............... 156/612 |
| 5,227,196 A | 7/1993 | Itoh |
| 5,238,877 A | 8/1993 | Russell |
| 5,244,818 A | 9/1993 | Jokers et al. |
| 5,248,564 A | 9/1993 | Ramesh |
| 5,260,394 A | 11/1993 | Tazaki et al. |
| 5,262,659 A | 11/1993 | Grudkowski et al. |
| 5,266,355 A | 11/1993 | Wernberg et al. |
| 5,268,327 A | 12/1993 | Vernon |
| 5,270,298 A | 12/1993 | Ramesh |
| 5,280,013 A | 1/1994 | Newman et al. |
| 5,281,834 A | 1/1994 | Cambou et al. |
| 5,283,462 A | 2/1994 | Stengel |
| 5,286,985 A | 2/1994 | Taddiken |
| 5,293,050 A | 3/1994 | Chapple-Sokol et al. |
| 5,306,649 A | 4/1994 | Hebert |
| 5,310,707 A | 5/1994 | Oishi et al. |
| 5,312,765 A | 5/1994 | Kanber |
| 5,313,058 A | 5/1994 | Friederich et al. |
| 5,314,547 A | 5/1994 | Heremans et al. |
| 5,315,128 A | 5/1994 | Hunt et al. |
| 5,323,023 A | 6/1994 | Fork |
| 5,326,721 A | 7/1994 | Summerfelt |
| 5,334,556 A | 8/1994 | Guldi |
| 5,352,926 A | 10/1994 | Andrews |

| | | | | | | |
|---|---|---|---|---|---|---|
| 5,356,509 | A | 10/1994 | Terranova et al. | 5,548,141 A | 8/1996 | Morris et al. |
| 5,356,831 | A | 10/1994 | Calviello et al. | 5,549,977 A | 8/1996 | Jin et al. |
| 5,357,122 | A | 10/1994 | Okubora et al. | 5,551,238 A | 9/1996 | Prueitt |
| 5,358,925 | A | 10/1994 | Neville Connell et al. | 5,552,547 A | 9/1996 | Shi |
| 5,362,972 | A | 11/1994 | Yazawa et al. | 5,553,089 A | 9/1996 | Seki et al. |
| 5,362,998 | A | 11/1994 | Iwamura et al. | 5,556,463 A | 9/1996 | Guenzer |
| 5,365,477 | A | 11/1994 | Cooper, Jr. et al. | 5,559,368 A | 9/1996 | Hu et al. |
| 5,371,621 | A | 12/1994 | Stevens | 5,561,305 A | 10/1996 | Smith |
| 5,371,734 | A | 12/1994 | Fischer | 5,569,953 A | 10/1996 | Kikkawa et al. |
| 5,372,992 | A | 12/1994 | Itozaki et al. | 5,570,226 A | 10/1996 | Ota |
| 5,373,166 | A | 12/1994 | Buchan et al. | 5,572,052 A | 11/1996 | Kashihara et al. |
| 5,387,811 | A | 2/1995 | Saigoh | 5,574,296 A | 11/1996 | Park et al. |
| 5,391,515 | A | 2/1995 | Kao et al. | 5,574,589 A | 11/1996 | Feuer et al. |
| 5,393,352 | A | 2/1995 | Summerfelt | 5,574,744 A | 11/1996 | Gaw et al. |
| 5,394,489 | A | 2/1995 | Koch | 5,576,879 A | 11/1996 | Nashimoto |
| 5,395,663 | A | 3/1995 | Tabata et al. | 5,578,162 A | 11/1996 | D'Asaro et al. |
| 5,397,428 | A | 3/1995 | Stoner et al. | 5,585,167 A | 12/1996 | Satoh et al. |
| 5,399,898 | A | 3/1995 | Rostoker | 5,585,288 A | 12/1996 | Davis et al. |
| 5,404,581 | A | 4/1995 | Honjo | 5,588,995 A | 12/1996 | Sheldon |
| 5,405,802 | A | 4/1995 | Yamagata et al. | 5,589,284 A | 12/1996 | Summerfelt et al. |
| 5,406,202 | A | 4/1995 | Mehrgardt et al. | 5,596,205 A | 1/1997 | Reedy et al. |
| 5,410,622 | A | 4/1995 | Okada et al. | 5,596,214 A | 1/1997 | Endo |
| 5,418,216 | A | 5/1995 | Fork | 5,602,418 A | 2/1997 | Imai et al. |
| 5,418,389 | A | 5/1995 | Watanabe | 5,603,764 A | 2/1997 | Matsuda et al. |
| 5,420,102 | A | 5/1995 | Harshavardhan et al. | 5,606,184 A | 2/1997 | Abrokwah et al. |
| 5,427,988 | A | 6/1995 | Sengupta et al. | 5,608,046 A | 3/1997 | Cook et al. |
| 5,430,397 | A | 7/1995 | Itoh et al. | 5,610,744 A | 3/1997 | Ho et al. |
| 5,436,759 | A | 7/1995 | Dijaii et al. | 5,614,739 A | 3/1997 | Abrokwah et al. |
| 5,438,584 | A | 8/1995 | Paoli et al. | 5,619,051 A * | 4/1997 | Endo |
| 5,441,577 | A | 8/1995 | Sasaki et al. | 5,621,227 A | 4/1997 | Joshi |
| 5,442,191 | A | 8/1995 | Ma | 5,623,439 A | 4/1997 | Gotoh et al. |
| 5,442,561 | A | 8/1995 | Yoshizawa et al. | 5,623,552 A | 4/1997 | Lane |
| 5,444,016 | A | 8/1995 | Abrokwah et al. | 5,629,534 A | 5/1997 | Inuzuka et al. |
| 5,446,719 | A | 8/1995 | Yoshida et al. | 5,633,724 A | 5/1997 | King et al. |
| 5,450,812 | A | 9/1995 | McKee et al. | 5,635,433 A | 6/1997 | Sengupta |
| 5,452,118 | A | 9/1995 | Maruska | 5,635,453 A | 6/1997 | Pique et al. |
| 5,453,727 | A | 9/1995 | Shibasaki et al. | 5,640,267 A | 6/1997 | May et al. |
| 5,466,631 | A | 11/1995 | Ichikawa et al. | 5,642,371 A | 6/1997 | Tohyama et al. |
| 5,473,047 | A | 12/1995 | Shi | 5,650,646 A | 7/1997 | Summerfelt |
| 5,473,171 | A | 12/1995 | Summerfelt | 5,656,382 A | 8/1997 | Nashimoto |
| 5,477,363 | A | 12/1995 | Matsuda | 5,659,180 A | 8/1997 | Shen et al. |
| 5,478,653 | A | 12/1995 | Guenzer | 5,661,112 A | 8/1997 | Hatta et al. |
| 5,479,033 | A | 12/1995 | Baca et al. | 5,666,376 A | 9/1997 | Cheng |
| 5,479,317 | A | 12/1995 | Ramesh | 5,667,586 A | 9/1997 | Ek et al. |
| 5,480,829 | A | 1/1996 | Abrokwah et al. | 5,668,048 A | 9/1997 | Kondo et al. |
| 5,481,102 | A | 1/1996 | Hazelrigg, Jr. | 5,670,798 A | 9/1997 | Schetzina |
| 5,482,003 | A | 1/1996 | McKee et al. | 5,670,800 A | 9/1997 | Nakao et al. |
| 5,484,664 | A | 1/1996 | Kitahara et al. | 5,674,366 A | 10/1997 | Hayashi et al. |
| 5,486,406 | A | 1/1996 | Shi | 5,674,813 A | 10/1997 | Nakamura et al. |
| 5,491,461 | A | 2/1996 | Partin et al. | 5,679,947 A | 10/1997 | Doi et al. |
| 5,492,859 | A | 2/1996 | Sakaguchi et al. | 5,679,965 A | 10/1997 | Schetzina |
| 5,494,711 | A | 2/1996 | Takeda et al. | 5,682,046 A | 10/1997 | Takahashi et al. |
| 5,504,035 | A | 4/1996 | Rostoker et al. | 5,684,302 A | 11/1997 | Wersing et al. |
| 5,504,183 | A | 4/1996 | Shi | 5,686,741 A | 11/1997 | Ohori et al. |
| 5,508,554 | A | 4/1996 | Takatani et al. | 5,689,123 A | 11/1997 | Major et al. |
| 5,510,665 | A | 4/1996 | Conley | 5,693,140 A * | 12/1997 | McKee et al. ............... 117/108 |
| 5,511,238 | A | 4/1996 | Bayraktaroglu | 5,696,392 A * | 12/1997 | Char et al. .................. 257/190 |
| 5,512,773 | A | 4/1996 | Wolf et al. | 5,719,417 A | 2/1998 | Roeder et al. |
| 5,514,484 | A | 5/1996 | Nashimoto | 5,725,641 A | 3/1998 | MacLeod |
| 5,514,904 | A | 5/1996 | Onga et al. | 5,729,394 A | 3/1998 | Sevier et al. |
| 5,515,047 | A | 5/1996 | Yamakido et al. | 5,729,641 A | 3/1998 | Chandonnet et al. |
| 5,515,810 | A | 5/1996 | Yamashita et al. | 5,731,220 A | 3/1998 | Tsu et al. |
| 5,516,725 | A | 5/1996 | Chang et al. | 5,733,641 A | 3/1998 | Fork et al. |
| 5,519,235 | A | 5/1996 | Ramesh | 5,734,672 A | 3/1998 | McMinn et al. |
| 5,523,602 | A | 6/1996 | Horiuchi et al. | 5,735,949 A | 4/1998 | Mantl et al. |
| 5,528,057 | A | 6/1996 | Yanagase et al. | 5,741,724 A | 4/1998 | Ramdani et al. |
| 5,528,067 | A | 6/1996 | Farb et al. | 5,745,631 A | 4/1998 | Reinker |
| 5,528,209 | A | 6/1996 | Macdonald et al. | 5,753,300 A | 5/1998 | Wessels et al. |
| 5,528,414 | A | 6/1996 | Oakley | 5,753,928 A | 5/1998 | Krause |
| 5,530,235 | A | 6/1996 | Stefik et al. | 5,753,934 A | 5/1998 | Yano et al. |
| 5,538,941 | A | 7/1996 | Findikoglu et al. | 5,754,319 A | 5/1998 | Van De Voorde et al. |
| 5,540,785 | A | 7/1996 | Dennard et al. | 5,754,714 A | 5/1998 | Suzuki et al. |
| 5,541,422 | A | 7/1996 | Wolf et al. | 5,760,426 A | 6/1998 | Marx et al. |

| | | | | | |
|---|---|---|---|---|---|
| 5,760,427 A | 6/1998 | Onda | 5,963,291 A | 10/1999 | Wu et al. |
| 5,760,740 A | 6/1998 | Blodgett | 5,966,323 A | 10/1999 | Chen et al. |
| 5,764,676 A | 6/1998 | Paoli et al. | 5,976,953 A | 11/1999 | Zavracky et al. |
| 5,767,543 A | 6/1998 | Ooms et al. | 5,977,567 A | 11/1999 | Verdiell |
| 5,770,887 A | 6/1998 | Tadatomo et al. | 5,981,400 A * | 11/1999 | Lo ............... 438/745 |
| 5,772,758 A | 6/1998 | Collins et al. | 5,981,976 A | 11/1999 | Murasato |
| 5,776,359 A | 7/1998 | Schultz et al. | 5,981,980 A | 11/1999 | Miyajima et al. |
| 5,776,621 A | 7/1998 | Nashimoto | 5,984,190 A | 11/1999 | Nevill |
| 5,777,350 A | 7/1998 | Nakamura et al. | 5,985,404 A | 11/1999 | Yano et al. |
| 5,777,762 A | 7/1998 | Yamamoto | 5,986,301 A * | 11/1999 | Fukushima et al. ......... 257/306 |
| 5,778,018 A | 7/1998 | Yoshikawa et al. | 5,987,011 A | 11/1999 | Toh |
| 5,778,116 A | 7/1998 | Tomich | 5,987,196 A | 11/1999 | Noble |
| 5,780,311 A | 7/1998 | Beasom et al. | 5,990,495 A | 11/1999 | Ohba |
| 5,789,733 A | 8/1998 | Jachimowicz et al. | 5,995,359 A | 11/1999 | Klee et al. |
| 5,789,845 A | 8/1998 | Wadaka et al. | 5,995,528 A | 11/1999 | Fukunaga et al. |
| 5,790,583 A | 8/1998 | Ho | 5,997,638 A | 12/1999 | Copel et al. |
| 5,792,569 A | 8/1998 | Sun et al. | 5,998,781 A | 12/1999 | Vawter et al. |
| 5,792,679 A | 8/1998 | Nakato | 5,998,819 A | 12/1999 | Yokoyama et al. |
| 5,796,648 A | 8/1998 | Kawakubo et al. | 6,002,375 A | 12/1999 | Corman et al. |
| 5,801,072 A | 9/1998 | Barber | 6,008,762 A | 12/1999 | Nghiem |
| 5,801,105 A | 9/1998 | Yano et al. | 6,011,641 A | 1/2000 | Shin et al. |
| 5,807,440 A | 9/1998 | Kubota et al. | 6,011,646 A | 1/2000 | Mirkarimi et al. |
| 5,810,923 A | 9/1998 | Yano et al. | 6,013,553 A | 1/2000 | Wallace et al. |
| 5,812,272 A | 9/1998 | King et al. | 6,020,222 A | 2/2000 | Wollesen |
| 5,814,583 A | 9/1998 | Itozaki et al. | 6,022,140 A | 2/2000 | Fraden et al. |
| 5,825,055 A | 10/1998 | Summerfelt | 6,022,410 A | 2/2000 | Yu et al. |
| 5,825,799 A | 10/1998 | Ho et al. | 6,022,671 A | 2/2000 | Binkley et al. |
| 5,827,755 A | 10/1998 | Yonchara et al. | 6,022,963 A | 2/2000 | McGall et al. |
| 5,828,080 A | 10/1998 | Yano et al. | 6,023,082 A | 2/2000 | McKee et al. |
| 5,830,270 A | 11/1998 | McKee et al. | 6,028,853 A | 2/2000 | Haartsen |
| 5,831,960 A | 11/1998 | Jiang et al. | 6,039,803 A * | 3/2000 | Fitzgerald et al. |
| 5,833,603 A | 11/1998 | Kovacs et al. | 6,045,626 A | 4/2000 | Yano et al. |
| 5,834,362 A | 11/1998 | Miyagaki et al. | 6,046,464 A | 4/2000 | Schetzina |
| 5,838,035 A | 11/1998 | Ramesh | 6,048,751 A | 4/2000 | D'Asaro et al. |
| 5,838,053 A | 11/1998 | Bevan et al. | 6,049,110 A | 4/2000 | Koh |
| 5,844,260 A | 12/1998 | Ohori | 6,049,702 A | 4/2000 | Tham et al. |
| 5,846,846 A | 12/1998 | Suh et al. | 6,051,858 A | 4/2000 | Uchida et al. |
| 5,852,687 A | 12/1998 | Wickham | 6,051,874 A | 4/2000 | Masuda |
| 5,857,049 A | 1/1999 | Beranek et al. | 6,055,179 A | 4/2000 | Koganei et al. |
| 5,858,814 A | 1/1999 | Goossen et al. | 6,058,131 A | 5/2000 | Pan |
| 5,861,966 A | 1/1999 | Ortel | 6,059,895 A | 5/2000 | Chu et al. |
| 5,863,326 A | 1/1999 | Nause et al. | 6,064,078 A | 5/2000 | Northrup et al. |
| 5,864,171 A | 1/1999 | Yamamoto et al. | 6,064,092 A | 5/2000 | Park |
| 5,869,845 A | 2/1999 | Vander Wagt et al. | 6,064,783 A | 5/2000 | Congdon et al. |
| 5,872,493 A | 2/1999 | Ella | 6,078,717 A | 6/2000 | Nashimoto et al. |
| 5,873,977 A | 2/1999 | Desu et al. | 6,080,378 A | 6/2000 | Yokota et al. |
| 5,874,860 A | 2/1999 | Brunel et al. | 6,083,697 A | 7/2000 | Beecher et al. |
| 5,878,175 A | 3/1999 | Sonoda et al. | 6,087,681 A | 7/2000 | Shakuda |
| 5,879,956 A | 3/1999 | Seon et al. | 6,088,216 A | 7/2000 | Laibowitz et al. |
| 5,880,452 A | 3/1999 | Plesko | 6,090,659 A | 7/2000 | Laibowitz et al. |
| 5,882,948 A | 3/1999 | Jewell | 6,093,302 A | 7/2000 | Montgomery |
| 5,883,564 A | 3/1999 | Partin | 6,096,584 A | 8/2000 | Ellis-Monaghan et al. |
| 5,883,996 A | 3/1999 | Knapp et al. | 6,100,578 A | 8/2000 | Suzuki |
| 5,886,867 A | 3/1999 | Chivukula et al. | 6,103,008 A | 8/2000 | McKee et al. |
| 5,888,296 A | 3/1999 | Ooms et al. | 6,103,403 A | 8/2000 | Grigorian et al. |
| 5,889,296 A | 3/1999 | Imamura et al. | 6,107,653 A | 8/2000 | Fitzgerald |
| 5,896,476 A | 4/1999 | Wisseman et al. | 6,107,721 A | 8/2000 | Lakin |
| 5,905,571 A | 5/1999 | Butler et al. | 6,108,125 A | 8/2000 | Yano |
| 5,907,792 A | 5/1999 | Droopad et al. | 6,110,813 A | 8/2000 | Ota et al. |
| 5,912,068 A | 6/1999 | Jia | 6,110,840 A | 8/2000 | Yu |
| 5,919,515 A | 7/1999 | Yano et al. | 6,113,225 A | 9/2000 | Miyata et al. |
| 5,919,522 A | 7/1999 | Baum et al. | 6,113,690 A | 9/2000 | Yu et al. |
| 5,926,493 A | 7/1999 | O'Brien et al. | 6,114,996 A | 9/2000 | Nghiem |
| 5,926,496 A | 7/1999 | Ho et al. | 6,121,642 A | 9/2000 | Newns |
| 5,937,115 A | 8/1999 | Domash | 6,121,647 A | 9/2000 | Yano et al. |
| 5,937,274 A | 8/1999 | Kondow et al. | 6,128,178 A | 10/2000 | Newns |
| 5,937,285 A | 8/1999 | Abrokwah et al. | 6,134,114 A | 10/2000 | Ungermann et al. |
| 5,948,161 A | 9/1999 | Kizuki | 6,136,666 A | 10/2000 | So |
| 5,953,468 A | 9/1999 | Finnila et al. | 6,137,603 A | 10/2000 | Henmi |
| 5,955,591 A | 9/1999 | Imbach et al. | 6,139,483 A | 10/2000 | Seabaugh et al. |
| 5,959,308 A | 9/1999 | Shichijo et al. | 6,140,746 A | 10/2000 | Miyashita et al. |
| 5,959,879 A | 9/1999 | Koo | 6,143,072 A | 11/2000 | McKee et al. |
| 5,962,069 A | 10/1999 | Schindler et al. | 6,143,366 A | 11/2000 | Lu |

| | | | |
|---|---|---|---|
| 6,146,906 A | 11/2000 | Inoue et al. |
| 6,150,239 A | 11/2000 | Goesele et al. |
| 6,151,240 A | 11/2000 | Suzuki |
| 6,153,010 A | 11/2000 | Kiyoku et al. |
| 6,153,454 A | 11/2000 | Krivokapic |
| 6,156,581 A | 12/2000 | Vaudo et al. |
| 6,173,474 B1 | 1/2001 | Conrad |
| 6,174,755 B1 | 1/2001 | Manning |
| 6,175,497 B1 | 1/2001 | Tseng et al. |
| 6,175,555 B1 | 1/2001 | Hoole |
| 6,180,252 B1 | 1/2001 | Farrell et al. |
| 6,180,486 B1 | 1/2001 | Leobandung et al. |
| 6,181,920 B1 | 1/2001 | Dent et al. |
| 6,184,044 B1 | 2/2001 | Sone et al. |
| 6,184,144 B1 | 2/2001 | Lo |
| 6,191,011 B1 | 2/2001 | Gilboa et al. |
| 6,194,753 B1 | 2/2001 | Seon et al. |
| 6,197,503 B1 | 3/2001 | Vo-Dinh et al. |
| 6,198,119 B1 | 3/2001 | Nabatame et al. |
| 6,204,525 B1 | 3/2001 | Sakurai et al. |
| 6,204,737 B1 | 3/2001 | Ella |
| 6,208,453 B1 | 3/2001 | Wessels et al. |
| 6,210,988 B1 | 4/2001 | Howe et al. |
| 6,211,096 B1 | 4/2001 | Allman et al. |
| 6,222,654 B1 | 4/2001 | Frigo |
| 6,224,669 B1 | 5/2001 | Yi et al. |
| 6,225,051 B1 | 5/2001 | Sugiyama et al. |
| 6,229,159 B1 | 5/2001 | Suzuki |
| 6,232,242 B1 | 5/2001 | Hata et al. |
| 6,232,806 B1 | 5/2001 | Woeste et al. |
| 6,232,910 B1 | 5/2001 | Bell et al. |
| 6,233,435 B1 | 5/2001 | Wong |
| 6,235,145 B1 | 5/2001 | Li et al. |
| 6,235,649 B1 | 5/2001 | Kawahara et al. |
| 6,238,946 B1 | 5/2001 | Ziegler |
| 6,239,012 B1 | 5/2001 | Kinsman |
| 6,239,449 B1 | 5/2001 | Fafard et al. |
| 6,241,821 B1 | 6/2001 | Yu et al. |
| 6,242,686 B1 | 6/2001 | Kishimoto et al. |
| 6,248,459 B1 | 6/2001 | Wang et al. |
| 6,248,621 B1 | 6/2001 | Wilk et al. |
| 6,252,261 B1 | 6/2001 | Usui et al. |
| 6,255,198 B1 | 7/2001 | Linthicum et al. |
| 6,256,426 B1 | 7/2001 | Duchet |
| 6,265,749 B1 | 7/2001 | Gardner et al. |
| 6,268,269 B1 | 7/2001 | Lee et al. |
| 6,271,619 B1 | 8/2001 | Yamada et al. |
| 6,275,122 B1 | 8/2001 | Speidell et al. |
| 6,277,436 B1 | 8/2001 | Stauf et al. |
| 6,278,137 B1 | 8/2001 | Shimoyama et al. |
| 6,278,138 B1 | 8/2001 | Suzuki |
| 6,278,523 B1 | 8/2001 | Gorecki |
| 6,278,541 B1 | 8/2001 | Baker |
| 6,291,319 B1 | 9/2001 | Yu et al. |
| 6,291,866 B1 | 9/2001 | Wallace |
| 6,297,598 B1 | 10/2001 | Wang et al. |
| 6,297,842 B1 | 10/2001 | Koizumi et al. |
| 6,300,615 B1 | 10/2001 | Shinohara et al. |
| 6,306,668 B1 | 10/2001 | McKee et al. |
| 6,307,996 B1 * | 10/2001 | Nashimoto et al. ......... 385/130 |
| 6,312,819 B1 | 11/2001 | Jia et al. |
| 6,313,486 B1 | 11/2001 | Kencke et al. |
| 6,316,785 B1 | 11/2001 | Nunoue et al. |
| 6,316,832 B1 | 11/2001 | Tsuzuki et al. |
| 6,319,730 B1 | 11/2001 | Ramdani et al. |
| 6,320,238 B1 | 11/2001 | Kizilyalli et al. |
| 6,326,637 B1 | 12/2001 | Parkin et al. |
| 6,326,645 B1 | 12/2001 | Kadota |
| 6,326,667 B1 | 12/2001 | Sugiyama et al. |
| 6,329,277 B1 | 12/2001 | Liu et al. |
| 6,338,756 B1 | 1/2002 | Dietze |
| 6,339,664 B1 | 1/2002 | Farjady et al. |
| 6,340,788 B1 | 1/2002 | King et al. |
| 6,341,851 B1 | 1/2002 | Takayama et al. |
| 6,343,171 B1 | 1/2002 | Yoshimura et al. |
| 6,345,424 B1 | 2/2002 | Hasegawa et al. |
| 6,348,373 B1 | 2/2002 | Ma et al. |
| 6,355,945 B1 | 3/2002 | Kadota et al. |
| 6,359,330 B1 | 3/2002 | Goudard |
| 6,362,017 B1 | 3/2002 | Manabe et al. |
| 6,362,558 B1 | 3/2002 | Fukui |
| 6,367,699 B1 | 4/2002 | Ackley |
| 6,372,356 B1 | 4/2002 | Thornton et al. |
| 6,372,813 B1 | 4/2002 | Johnson et al. |
| 6,376,337 B1 * | 4/2002 | Wang et al. ................. 438/478 |
| 6,389,209 B1 | 5/2002 | Suhir |
| 6,391,674 B1 | 5/2002 | Ziegler |
| 6,392,253 B1 | 5/2002 | Saxena |
| 6,392,257 B1 | 5/2002 | Ramdani et al. |
| 6,393,167 B1 | 5/2002 | Davis et al. |
| 6,404,027 B1 | 6/2002 | Hong et al. |
| 6,410,941 B1 | 6/2002 | Taylor et al. |
| 6,410,947 B1 | 6/2002 | Wada |
| 6,411,756 B1 | 6/2002 | Sadot et al. |
| 6,415,140 B1 | 7/2002 | Benjamin et al. |
| 6,417,059 B1 | 7/2002 | Huang |
| 6,419,849 B1 | 7/2002 | Qiu et al. |
| 6,427,066 B1 | 7/2002 | Grube |
| 6,432,546 B1 | 8/2002 | Ramesh et al. |
| 6,438,281 B1 | 8/2002 | Tsukamoto et al. |
| 6,445,724 B1 | 9/2002 | Abeles |
| 6,452,232 B1 | 9/2002 | Adan |
| 6,461,927 B1 | 10/2002 | Mochizuki et al. |
| 6,462,360 B1 | 10/2002 | Higgins, Jr. et al. |
| 6,477,285 B1 | 11/2002 | Shanley |
| 6,496,469 B1 | 12/2002 | Uchizaki |
| 6,498,358 B1 | 12/2002 | Lach et al. |
| 6,501,121 B1 | 12/2002 | Yu et al. |
| 6,504,189 B1 | 1/2003 | Matsuda et al. |
| 6,524,651 B1 | 2/2003 | Gan et al. |
| 6,528,374 B1 | 3/2003 | Bojarczuk, Jr. et al. |
| 6,538,359 B1 | 3/2003 | Hiraku et al. |
| 6,589,887 B1 | 7/2003 | Dalton et al. |
| 2001/0013313 A1 | 8/2001 | Droopad et al. |
| 2001/0020278 A1 | 9/2001 | Saito |
| 2001/0036142 A1 | 11/2001 | Kadowaki et al. |
| 2001/0055820 A1 | 12/2001 | Sakurai et al. |
| 2002/0006245 A1 | 1/2002 | Kubota et al. |
| 2002/0008234 A1 | 1/2002 | Emrick |
| 2002/0021855 A1 | 2/2002 | Kim |
| 2002/0030246 A1 | 3/2002 | Eisenbeiser et al. |
| 2002/0047123 A1 | 4/2002 | Ramdani et al. |
| 2002/0047143 A1 | 4/2002 | Ramdani et al. |
| 2002/0052061 A1 | 5/2002 | Fitzgerald |
| 2002/0072245 A1 | 6/2002 | Ooms et al. |
| 2002/0076878 A1 | 6/2002 | Wasa et al. |
| 2002/0079576 A1 | 6/2002 | Seshan |
| 2002/0131675 A1 | 9/2002 | Litvin |
| 2002/0140012 A1 | 10/2002 | Droopad |
| 2002/0145168 A1 | 10/2002 | Bojarczuk, Jr. et al. |
| 2002/0179000 A1 | 12/2002 | Lee et al. |
| 2002/0195610 A1 | 12/2002 | Klosowiak |

FOREIGN PATENT DOCUMENTS

| | | |
|---|---|---|
| DE | 197 12 496 | 10/1997 |
| DE | 198 29 609 | 1/2000 |
| DE | 100 17 137 | 10/2000 |
| EP | 0 247 722 | 12/1987 |
| EP | 0 250 171 | 12/1987 |
| EP | 0 300 499 | 1/1989 |
| EP | 0 309 270 | 3/1989 |
| EP | 0 331 338 | 9/1989 |
| EP | 0 331 467 | 9/1989 |
| EP | 0 342 937 | 11/1989 |
| EP | 0 392 714 | 10/1990 |

| | | | | | |
|---|---|---|---|---|---|
| EP | 0 412 002 | 2/1991 | JP | 01-196809 | 8/1989 |
| EP | 0 455 526 | 6/1991 | JP | 03-149882 | 11/1989 |
| EP | 0 483 993 | 5/1992 | JP | HEI 2-391 | 1/1990 |
| EP | 0 494 514 | 7/1992 | JP | 02051220 | 2/1990 |
| EP | 0 514 018 | 11/1992 | JP | 3-41783 | 2/1991 |
| EP | 0 538 611 | 4/1993 | JP | 03046384 | 2/1991 |
| EP | 0 581 239 | 2/1994 | JP | 3-171617 | 7/1991 |
| EP | 0 600 658 | 6/1994 | JP | 03-188619 | 8/1991 |
| EP | 0 602 568 | 6/1994 | JP | 5-48072 | 2/1993 |
| EP | 0 607 435 | 7/1994 | JP | 5-086477 | 4/1993 |
| EP | 0 614 256 | 9/1994 | JP | 5-152529 | 6/1993 |
| EP | 0 619 283 | 10/1994 | JP | 05150143 | 6/1993 |
| EP | 0 630 057 | 12/1994 | JP | 05 221800 | 8/1993 |
| EP | 0 661 561 | 7/1995 | JP | 5-232307 | 9/1993 |
| EP | 0 860 913 | 8/1995 | JP | 5-238894 | 9/1993 |
| EP | 0 682 266 | 11/1995 | JP | 5-243525 | 9/1993 |
| EP | 0 711 853 | 5/1996 | JP | 5-291299 | 11/1993 |
| EP | 0 766 292 | 4/1997 | JP | 06-069490 | 3/1994 |
| EP | 0 777 379 | 6/1997 | JP | 6-232126 | 8/1994 |
| EP | 0 810 666 | 12/1997 | JP | 6-291299 | 10/1994 |
| EP | 0 828 287 | 3/1998 | JP | 6-334168 | 12/1994 |
| EP | 0 852 416 | 7/1998 | JP | 0812494 | 1/1996 |
| EP | 0 875 922 | 11/1998 | JP | 9-67193 | 3/1997 |
| EP | 0 881 669 | 12/1998 | JP | 9-82913 | 3/1997 |
| EP | 0 884 767 | 12/1998 | JP | 10-256154 | 9/1998 |
| EP | 0 926 739 | 6/1999 | JP | 10-269842 | 10/1998 |
| EP | 0 957 522 | 11/1999 | JP | 10-303396 | 11/1998 |
| EP | 0 964 259 | 12/1999 | JP | 10-321943 | 12/1998 |
| EP | 0 964 453 | 12/1999 | JP | 11135614 | 5/1999 |
| EP | 0 993 027 | 4/2000 | JP | 11-238683 | 8/1999 |
| EP | 0 999 600 | 5/2000 | JP | 11-260835 | 9/1999 |
| EP | 1 001 468 | 5/2000 | JP | 01 294594 | 11/1999 |
| EP | 1 035 759 | 9/2000 | JP | 11340542 | 12/1999 |
| EP | 1 037 272 | 9/2000 | JP | 2000-068466 | 3/2000 |
| EP | 1 043 426 | 10/2000 | JP | 2 000 1645 | 6/2000 |
| EP | 1 043 427 | 10/2000 | JP | 2000-278085 | 10/2000 |
| EP | 1 043 765 | 10/2000 | JP | 2000-349278 | 12/2000 |
| EP | 1 054 442 | 11/2000 | JP | 2000-351692 | 12/2000 |
| EP | 1 069 605 | 1/2001 | JP | 2001-196892 | 7/2001 |
| EP | 1 069 606 | 1/2001 | JP | 2002-9366 | 1/2002 |
| EP | 1 085 319 | 3/2001 | WO | WO 92/10875 | 6/1992 |
| EP | 1 089 338 | 4/2001 | WO | WO 93/07647 | 4/1993 |
| EP | 1 109 212 | 6/2001 | WO | WO 94/03908 | 2/1994 |
| EP | 1 176 230 | 1/2002 | WO | WO 95/02904 | 1/1995 |
| FR | 2 779 843 | 12/1999 | WO | WO 97/45827 | 12/1997 |
| GB | 1 319 311 | 6/1970 | WO | WO 98/05807 | 1/1998 |
| GB | 2 152 315 | 7/1985 | WO | WO 98/20606 | 5/1998 |
| GB | 2 335 792 | 9/1999 | WO | WO 99/14797 | 3/1999 |
| JP | 52-88354 | 7/1977 | WO | WO 99/14804 | 3/1999 |
| JP | 52-89070 | 7/1977 | WO | WO 99/19546 | 4/1999 |
| JP | 52-135684 | 11/1977 | WO | WO 99/63580 | 12/1999 |
| JP | 54-134554 | 10/1979 | WO | WO 99/67882 | 12/1999 |
| JP | 55-87424 | 7/1980 | WO | 00/06812 * | 2/2000 |
| JP | 58-075868 | 5/1983 | WO | WO 00/06812 | 2/2000 |
| JP | 58-213412 | 12/1983 | WO | WO 00/16378 | 3/2000 |
| JP | 59-044004 | 3/1984 | WO | WO 00/33363 | 6/2000 |
| JP | 59-073498 | 4/1984 | WO | WO 00/48239 | 8/2000 |
| JP | 59066183 | 4/1984 | WO | WO 01/04943 A1 | 1/2001 |
| JP | 60-161635 | 8/1985 | WO | WO 01/16395 | 3/2001 |
| JP | 60-210018 | 10/1985 | WO | WO 01/33585 | 5/2001 |
| JP | 60-212018 | 10/1985 | WO | WO 01/37330 | 5/2001 |
| JP | 61-36981 | 2/1986 | WO | WO 01/59814 A2 | 8/2001 |
| JP | 61-63015 | 4/1986 | WO | WO 01/59820 A1 | 8/2001 |
| JP | 61-108187 | 5/1986 | WO | WO 01/59821 A1 | 8/2001 |
| JP | 62-245205 | 10/1987 | WO | WO 01/59837 | 8/2001 |
| JP | 63-34994 | 2/1988 | WO | WO 02 01648 | 1/2002 |
| JP | 63-131104 | 6/1988 | WO | WO 02/03113 | 1/2002 |
| JP | 63-198365 | 8/1988 | WO | WO 02/03467 | 1/2002 |
| JP | 63-289812 | 11/1988 | WO | WO 02/03480 | 1/2002 |
| JP | 64-50575 | 2/1989 | WO | WO 02/08806 | 1/2002 |
| JP | 64-52329 | 2/1989 | WO | WO 02/009150 | 1/2002 |
| JP | 1-102435 | 4/1989 | WO | WO 02/09160 A2 | 1/2002 |
| JP | 1-179411 | 7/1989 | WO | WO 02/11254 | 2/2002 |

| WO | WO 02/33385 A2 | 4/2002 |
| WO | WO 02/47127 A2 | 6/2002 |
| WO | WO 02/50879 | 6/2002 |
| WO | WO 02/099885 | 12/2002 |
| WO | WO 03/012874 | 2/2003 |

OTHER PUBLICATIONS

Chyuan-Wei Chen et al; "Liquid-phase epitaxial growth and characterization of InGaAsP layers grown on GaAsP substrates for application to orange light-emitting diodes"; 931 Journal of Applied Physics; 77 (1995) 15 Jan., No. 2; Woodbury, NY, US; pp. 905-909.

W. Zhu et al. ; "Oriented diamond films grown on nickel substrates"; 320 Applied Physics Letters; 63(1993) Sep., No. 12, Woodbury, NY, US; pp. 1640-1642.

M. Schreck et al. ; "Diamond/Ir/SrTiO3: A material combination for improved heteroepitaxial diamond films"; Applied Physics Letters; vol. 74, No. 5; Feb. 1, 1999; pp. 650-652.

Yoshihiro Yokota et al. ; "Cathodoluminescence of boron-doped heteroepitaxial diamond films on platinum"; Diamond and Related Materials 8(1999) ; pp. 1587-1591.

J.R. Busch et al. ; "Linear Electro-Optic Response in SOL-GEL PZT Planar Waveguide" ; Electronics Letters; Aug. 13, 1992; vol. 28, No. 17; pp. 1591-1592.

R. Droopad et al; "Epitaxial Oxide Films on Silicon: Growth, Modeling and Device Properties" ; Mat. Res. Soc. Symp. Proc. vol. 619; 2000 Materials Research Society; pp. 155-165.

H. Ohkubo et al. ; "Fabrication of High Quality Perovskite Oxide Films by Lateral Epitaxy Verified with RHEED Oscillation" ; 2419A Int. Conf. on Solid State Devices & Materials, Tsukuba, Aug. 26-28 (1992) ; pp. 457-459.

Lin Li; "Ferroelectric/Superconductor Heterostructures" ; Materials Science and Engineering; 29 (2000) pp. 153-181.

L. Fan et al. ; "Dynaamic Beam Switching of Vertical-Cavity Surface-Emitting Lasers with Integrated Optical Beam Routers" ; IEEE Photonics Technology Letters; vol. 9, No. 4; Apr. 4, 1997; pp. 505-507.

Y. Q. Xu. et al. ; "(Mn, Sb) dropped-Pb(Zr,Ti)O3 infrared detector arrays" ; Journal of Applied Physics; vol. 88, No. 2; Jul. 15, 2000; pp. 1004-1007.

Kiyoko Kato et al. ; "Reduction of dislocations in InGaAs layer on GaAs using epitaxial lateral overgrowth" ; 2300 Journal of Crystal Growth 115 (1991) pp. 174-179; Dec. 1991.

Yi W. et al; "Mechanism of cleaning Si (100) surface using Sr and SrO for the growth of crystalline SrTiO/sub 2/films" Journal of Vacuum Science & Technology, vol. 20, No. 4, Jul. 2002 pp. 1402-1405.

Xiaming Hu et al; "Sr/Si template formation for the epitaxial growth of SrTiO/sub 3/on silicon" Materials Research Society Proceedings, vol. 716, 2002, pp. 261-266.

Peter Weiss; "Speed demon gets hooked on silicon"; Science News Online; Sep. 15, 2001; pp. 1-3.

"Motorola Develops New Super-Fast Chip"; USA Today; Sep. 4, 2001.

Lori Valigra; "Motorola Lays GaAs on Si Wafer"; AsiaBizTech; Nov. 2001pp. 1-3.

"Holy Grail! Motorola Claims High-Yield GaAs Breakthrough"; Micromagazine.com (no date available); pp. 1-3.

Jong-Gul Yoon; "Growth of Ferroelectric LiNbO3 Thin Film on MgO-Buffered Si by the Sol-Gel Method"; Journal of the Korean Physical Society (Proc. Suppl.); vol. 29, Nov. 1996; pp. S648-S651.

V. Bornand et al.; "Deposition of LiTaO3 thin films by pyrosol process"; Thin Solid Films 304 (1997); pp. 239-244.

R. Droopad et al.; "Development of high dielectric constant epitaxial oxides on silicon by molecular beam epitaxy"; Materials Science and Engineering B87 (2001); pp. 292-296.

A.K. Sharma et al.; "Integration of Pb(Zr0.52Ti0.48)O3 epilayers with Si by domain epitaxy"; Applied Physics Letters, vol. 76, No. 11; Mar. 13, 2000; pp. 1458-1460.

Dwight C. Streit et al; "High Reliability GaAs-AlGaAs HBT's by MBE with Be Base Doping and InGaAs Emitter Contacts"; 8179 Ieee Electron Device Letters; 12(1991) Sep., No. 9, New York, US.

C. Y. Hung et al; "Piezoelectrically induced stress tuning of electro-optic devices"; 320 Applied Physics Letters; 59(1991) 30 Dec., No. 27, New York, US.

J. Piprek; "Heat Flow Analysis of Long-Wvelength VCSELs with Various DBR Materials"; University of Delaware, Materials Science, Newark, DE, 19716-3106; Oct. 31, 1994; pp. 286-287.

P. Mackowiak et al.; "Some aspects of designing an efficient nitride VCSEL resonator"; J. Phys. D: Appl. Phys. 34(2001); pp. 954-958.

M.R. Wilson et al.; GaAs-On-Si: A GaAs IC Manufacturer's Perspective; GaAs IC Symposium, IEEE, 1988; pp. 243-246.

Y. Kitano et al.; "Thin film crystal growth of BaZrO3 at low oxygen partial pressure"; Journal of Crystal Growth 243 (2002); pp. 164-169.

M.E. Hawley; et al; "Microstructural Study of Colossal Magneto-Resistive Films As a Function of Growth Temperature, As Deposited and Annealed"; 401, 1996; pp. 531-536.

Nakagawara et al., Effects of Buffer Layers In Epitaxial Growth of SrTiO$_3$ Thin Film on Si(100), *J. Appl. Phys.*, 78 (12), Dec. 15, 1995, pp. 7226-7230.

Suzuki et al., "A Proposal of Epitaxial Oxide Thin Film Structures For Future Oxide Electronics," *Materials Science and Engineering B41*, (1996), pp. 166-173.

W. F. Egelhoff et al., "Optimizing GMR Spin Valves: The Outlook for Improved Properties", *1998 Int'l Non Volatile Memory Technology Conference*, pp. 34-37.

Wang et al., "Processing and Performance of Piezoelectric Films", Univ. Of MD, Wilcoxon Research Col, and Motorola Labs, May 11, 2000.

M. Rotter et al., "Nonlinear Acoustoelectric Interactions in GaAs/LiNbO$_3$ Structures", *Applied Physics Letters*, vol. 75(7), Aug. 16, 1999, pp. 965-967.

K. Sreenivas et al., "Surface Acoustic Wave Propagation on Lead Zirconate Titanate Thin Films," *Appl. Phys. Lett.* 52 (9), Feb. 29, 1998, pp. 709-711.

M. Rotter et al., "Single Chip Fused Hybrids for Acousto-Electric and Acousto-Optic Applications," *1997 Applied Physics Letters*, vol. 70(16), Apr. 21, 1997, pp. 2097-2099.

A. Mansingh et al., "Surface Acoustic Wave Propagation in PZT/YBCO/SrTiO$_3$ and PbTiO$_3$/YBCO/SrTiO$_3$ Epitaxial Heterostructures," *Ferroelectric*, vol. 224, pp. 275-282, 1999.

S. Mathews et al., "Ferroelectric Field Effect Transistor Based on Epitaxial Perovskite Heterostructures", Science, vol. 276, Apr. 11, 1997, pp. 238-240.

R. Houdre et al., "Properties of GaAs on Si Grown by Molecular Beam Epitaxy," *Solid State and Materials Sciences*, vol. 16, Issue 2, 1990, pp. 91-114.

S. F. Fang et al., "Gallium Arsenide and Other Compound Semiconductors on Silicon," *J. Appl. Phys.*, 68(7), Oct. 1, 1990, pp. R31-R58.

Carlin et al., Impact of GaAs Buffer Thickness on Electronic Quality of GaAs Grown on Graded Ge/GeSi/Si Substrates, *Appl. Phys. Letter*, vol. 76, No. 14, Apr. 2000, pp. 1884-1886.

Ringel et al., "Epitaxial Integration of III-V Materials and Devices with Si Using Graded GeSi Buffers," 27th International Symposium on Compound Semiconductors, Oct. 2000.

Zogg et al., "Progress In Compound-Semiconductor-on-Silicon-Heteroepitaxy with Fluoride Buffer Layers," *J. Electrochem Soc.*, vol. 136, No. 3, Mar. 1998, pp. 775-779.

Xiong et al., "Oxide Defined GaAs Vertical-Cavity Surface-Emitting Lasers on Si Substrates," *IEEE Photonics Technology Letters*, vol. 12, No. 2, Feb. 2000, pp. 110-112.

Clem et al., "Investigation of PZT//LSCO//Pt//Aerogel Thin Film Composites for Uncooled Pyroelectric IR Detectors," *Mat. Res. Soc. Symp. Proc.*, vol. 541, pp. 661-666, 1999.

Gunapala et al., "Bound-To-Quasi-Bound Quantum-Well Infrared Photodetectors," NASA Tech Brief, vol. 22, No. 9, Sep. 1998.

Bruley et al., "Nanostructure and Chemistry of a (100)MgO/(100) GaAs Interface," *Appl. Phys Lett*, 65(5), Aug. 1994, pp. 564-566.

Fork et al., "Epitaxial MgO On Si(001) for Y-Ba-Cu-O Thin Film Growth by Pulsed Laser Deposition," *Appl. Phys Lett.*, 58(20), May 20, 1991, pp. 2294-2296.

Himpsel et al., "Dialectrics on Semiconductors," *Materials Science and Engineering*, B1(1988), pp. 9-13.

Li et al., "Epitaxial La$_{0.67}$Sr$_{0.33}$MnO$_3$ Magnetic Tunnel Junctions," *J. Appl. Phys.* 81(8), Apr. 15, 1997, pp. 5509-5511.

O'Donnell et al., "Colossal Magnetoresistance Magnetic Tunnel Junctions Grown by Molecular-Beam Epitaxy," *Appl. Physics Letters*, vol. 76, No. 14, Apr. 3, 2000, pp. 1914-1916.

Mikami et al., "Formation of Si Epi/MgO-Al$_2$O$_3$Epi/SiO$_3$/Si and Its Epitaxial Film Quality," Fundamental Research Laboratories and Microelectronics Laboratories, pp. 31-34, 1983.

T. Asano et al., "An Epitaxial Si/Insulator/Si Structure Prepared by Vacuum Deposition of CaF$_2$ and Silicon," *Thin Solid Films*, vol. 93 (1982), pp. 143-150.

T. Chikyow et al., "Reaction and Regrowth Control of CeO$_2$ on Si(111) Surface for the Silicon-On-Insulator Structure," *Appl. Phys. Lett.*, vol. 65, No. 8, Aug. 22, 1994, pp. 1030-1032.

J.F. Kang, et al., "Epitaxial Growth of CeO$_2$(100) Films on Si(100) Substrates by Dual Ion Beams Reactive Sputtering," *Solid State Communications*, vol. 108, No. 4, pp. 225-227, 1998.

R.A. Morgan et al., "Vertical-Cavity Surface-Emitting Lasers Come of Age," *SPIE*, vol. 2683, pp. 18-29.

"Technical Analysis of Qualcomm QCP-800 Portable Cellular Phone (Transmitter Circuitry)," Talus Corporation, Qualcomm QCP-800 Technical Analysis Report, Dec. 10, 1996, pp. 5-8.

Jo-Ey Wong, et al.; "An Electrostatically-Actuated MEMS Switch for Power Applications"; IEEE, 2000; pp. 633-638.

T. Mizuno, et al.; "Electron and Hole Mobility Enhancement in Strained-Si MOSFET's on SiGe-on-Insulator Substrates Fabricated by SIMOX Technology"; IEEE Electron Device Letters, vol. 21. No. 5, May 2000; pp. 230-232.

F.M. Buffer, et al.; "Strain-dependence of electron transport in bulk Si and deep-submicron MOSFET's" Computatural Electronics, 2000, Book of Abstracts, IWCE Glasgow 2000, 7th Int'l Workshop on, 2000; pp. 64-65.

S.S. Lu, et al.; "Piezoelectric field effect transistor (PEFET) using In$_{0.2}$Ga$_{0.8}$As/Al$_{0.35}$Ga$_{0.65}$As/In$_{0.2}$Ga$_{0.8}$As/GaAs Strained layer structure on (111)B GaAs substrate"; Electronics Letters, 12TH Ma 1994, vol. 30, No. 10; pp. 823-825.

Kihong Kim, et al."On-Chip Wireless Interconnection with Integrated Antennas"; 2000 IEEE; pp. 20.2.1-20.3.4.

G. Passiopoulos, et al.; "V-Band Single Chip, Direct Carrier BPSK Modulation Transmitter with Integrated Patch Antenna"; 1998 IEEE MTT-S Digest; pp. 305-308.

Mau-Chung Frank Chang, et al.; "RF/Wireless Interconnect for Inter- and Intra-Chip Communications"; Proceedings of the IEEE, vol. 89, No. 4, Apr. 2001; pp. 456-466.

The Electronics Industry Report; Prismark; 2001; pp. 111-120.

J.K. Abrokwah, et al.; "A Manufacturable Complementary GaAs Process"; GaAs IC Symposium, IEEE, 1993; pp. 127-130.

H. Nagata, "A Preliminary Consideration of the Growth Behaviour of CeO$_2$, SrTiO$_3$ and SrVO$_3$ Films on Si Substrate," *Thin Solid Films*, 224, 1993, pp. 1-3.

Nagata et al., "Heteroepitaxial Growth of CeO$_2$(001) Films on Si(001) Substrates by Pulsed Laser Deposition in Ultrahigh Vacuum," *Jpn. Jour. Appl. Phys.*, vol. 30, No. 6B, Jun. 1991, pp. L1136-L1138.

Kado et al., "Heteroepitaxial Growth of SrO Films on Si Substrates," *J. Appl. Phys.*, 61(6), Mar. 15, 1987, pp. 2398-2400.

H. Ishiwara et al., "Epitaxial Growth of Perovskite Type Oxide Films on Substrates"; *Materials Research Symposium Proceedings*, vol. 220, pp. 595-600, Apr. 29-May 3, 1991.

J.K. Abrokwah, et al.; "A Manufacturable High-Speed Low-Power Complementary GaAs Process"; Extended Abstracts of the 1994 International Conference on Solid State Devices and Materials, Yokohama, 1994, pp. 592-594.

C.J. Palmstrom et al.; "Stable and Epitaxial Contacts to III-V Compound Semiconductors"; Contacts to Semiconductors Fundamentals and Technology; Noyles Publications, 1993; pp. 67-150.

Jayshri Sabarinathat, et al.; "Submicron three-dimensional infrared GaAs/Al$_x$O$_y$-based photonic crystal using single-step epitaxial growth"; Applied Physics Letters, vol. 78, No. 20, May 14, 2001; pp. 3024-3026.

Philip Ball; "The Next Generation of Optical Fibers"; Technology Review, May 2001; pp. 55-61.

John D. Joannopoulos, et al.; "Molding the Flow of Light"; Photonic Crystals; Princeton University Press, 1995.

Thomas F. Krauss, et al.; "Photonic crystals in the optical regime—past, present and future"; Progress in Quantum Electronics 23 (1999) 51-96.

G. H. Jin, et al.; "PLZT Film Waveguide Mach-Zehnder Electrooptic Modulator"; Journal of Lightwave Technology, vol. 18, No. 6. Jun. 2000; pp. 807-812.

D.E. Aspnes, et al.; "Steps on (001) silicon surfaces"; J. Vac. Sci. Technol. B, vol. 5, No. 4, Jul./Aug. 1987; pp. 939-944.

D.M. Newns, et al.; "Mott transition field effect transistor"; Applied Physics Letters, vol. 73, No. 6, Aug. 10, 1998; pp. 780-782.

Lucent Technologies, Inc. "Arrayed Waveguide Grating Multiplexer/Demultiplexer"; Jan. 2000; 4 pages.

Hisashi Shichijo, et al.; "Co-Integration of GaAs MESFET and Si CMOS Circuits"; IEEE Electron Device Letters, vol. 9, No. 9, Sep. 1988; pp. 444-446.

H. Shichijo, et al.; "GaAs MESFET and Si CMOS Cointegration and Circuit Techniques"; 1988 IEEE; GaAs IC Symposium—239-242.

H. Shichijo, et al.; "Monolithic Process for Co-Integration of GaAs and Silicon Circuits"; 1988 IEEE; pp. 778-781.

Z.H. Zhu, et al. "Growth of InGaAs multi-quantum wells at 1.3 m wavelength on GaAs compliant substrates"; Applied Physics Letters, vol. 72, No. 20, May 18, 1998; pp. 2598-2600.

Kurt Eisenbeiser, et al.; "Metamorphic InAlAs/InGaAs Enhancement Mode HEMT's on GaAs Substrates"; IEEE Electron Device Letters, vol. 20, No. 10, Oct. 1999; pp. 507-509.

Tomonori Nagashima, et al.; "Three-Terminal Tandem Solar Cells With a Back-Contact Type Bottom Cell" Higashifuji Technical Center, Toyota Motor Corporation; 4 pages.

James Schellenberg, et al.; "Low-Loss, Planar Monolithic Baluns for K/Ka-Band Applications"; 1999 IEEE MTT-S Digest; pp. 1733-1736.

Arnold Leitner et al; "Pulsed Laser Deposition of Superconducting Strontium Titanate Thin-Films"; ; Session K11-Thin Films and Borocarbides; Mixed Session, Wednesday Afternoon; Mar. 19, 1997; Room 1202 B, Conv. Center (Abstract).

R.D. Vispute; "High quality optoelectronic grade epitaxial AlN films on -$Al_2O_3$, Si and 6H-SiC by pulsed laser deposition"; Thin Solid Films 299 (1997), pp. 94-103.

T. Warren Weeks, et al.; "GaN thin films deposited via organometallic vapor phase epitaxy on (6H)-SiC(0001) using high-temperature monocrystalline AlN buffer layers" 320 Applied Physics Letters, vol. 67, No. 3, Jul. 17, 1995, ppl401-403.

Z. Yu, et al.; "Epitaxial oxide thin films on SI(001)*"; J. Vac. Sci. Technol. B. vol. 18, No. 4, Jul./Aug. 2000; pp. 2139-2145.

Gentex Corporate Website; Photoelectric Smoke Detectors—How They Work; 2001.

Jeffrey B. Casady, et al.; "A Hybrid 6H-SiC Temperature Sensor Operational from 25 C to 500 C"; IEEE Transactions on Components, Packaging, and Manufacturing Technology—Part A, vol. 19, No. 3, Sep. 1996; pp. 416-422.

Ronald W. Waynant, et al.; "Optoelectronic Integrated Circuits"; Electro-Optics Handbook, McGraw-Hill, Inc., 1994; Chapter Twenty Seven.

Antonio Mecozzi, et al.; "The Roles of Semiconductor Optical Amplifiers in Optical Networks"; Optics & Photonics News; Mar. 2001; pp. 37-42.

D.A. Francis, et al.; "A single-chip linear optical amplifier"; OFC, 2001; Mar. 17-22, 2001.

G. Vogg et al.; "Epitaxial alloy films of zintl-phase Ca(Si1-xGex)2"; Journal of Crystal Growth 223 (2001); pp. 573-576.

Peter S. Guilfoyle, et al.; "Optoelectronic Architecture for High-Speed Switching and Processing Applications"; 1998 The Photonics Design and Applications Handbook; pp. H-399-H-406.

Gerald B. Stringfellow; "Organometallic Vapor-Phase Epitaxy: Theory and Practice"; Departments of Materials Science and Engineering and Electrical Engineering, University of Utah; Academic Press, 1989.

M.A. Herman, et al.; "Molecular Beam Epitaxy Fundamentals and Current Status"; Springer-Verlag Berlin Heidelberg, 1989, 1996.

"Integration of GaAs on Si Using a Spinel Buffer Layer", IBM Technical Bulletin, vol. 30, No. 6, Nov. 1987, p. 365.

"GaInAs Superconducting FET," IBM Technical Bulletin, vol. 36, No. 8, Aug. 1993, p. 655-656.

"Epitaxial 3d Structure Using Mixed Spinels," IBM Technical Bulletin, vol. 30, No. 3, Aug. 1987, p. 1271.

Moon et al., "Roles of Buffer Layers in Epitaxial Growth of $SrTiO_3$ Films on Silicon Substrates," *Japan J of Appl. Phys.*, vol. 33, Mar. 1994, pp. 1472-1477.

Yodo et al., GaAs Heteroepitaxial Growth on Si Substrates with Thin Si Interlayers *in situ* Annealed at High Temperatures, *8257b Journal of Vacuum Science & Technology*, May/Jun., 1995 vol. 13, No. 3, pp. 1000-1005.

Cuomo et al., "Substrate Effect on the Superconductivity of $YBa_2Cu_3O_7$ Thin Films," AIP Conference 1988, pp. 141-148.

McKee et al., "Crystalline Oxides on Silicon: The First Five Monolayers," *Physical Review Letters*, vol. 81, No. 14, Oct. 1998, pp. 3014-3017.

McKee et al., "Molecular Beam Epitaxy Growth of Epitaxial Barium Silicide, Barium Oxide, and Barium Titanate on Silicon," *1991 American Institute of Physics*, pp. 782-784, Aug. 13, 1991.

Tambo et al., Molecular Beam Epitaxy Growth of $SrTiO_3$ Films on Si(100)-2x1 with SrO Buffer Layer, *Jpn. J. Appl. Phys.*, vol. 37, 1998, pp. 4454-4459.

McKee et al., "The MBE Growth and Optical Quality of $BaTiO_3$ and $SrTiO_3$ Thin Films on MgO," *Mat. Res. Soc. Symp. Proc.*, vol. 341, Apr. 1994, pp. 309-314.

McKee et al., "$BaSi_2$ and Thin Film Alkaline Earth Silicides on Silicon," *Appl. Phys. Lett.*, 63 (20), Nov. 1993, pp. 2818-2820.

McKee et al., "Surface Structures and the Orthorhombic Transformation of Thin Film $BaSi_2$ on Silicon," *Mat. Res. Soc. Symp. Proc.*, vol. 221, pp. 131-136,.

Brian A. Floyd, et al.; "The projected Power Consumption of a Wireless Clock Distribution System and Comparison to Conventional Distribution Systems"; IEEE, 1999; pp. IITC99-249-IITC99-250.

Mori et al., "Epitaxial Growth of $SrTiO_3$ Films on Si(100) Substrates Using a Focused Electron Beam Evaporation Method," *Jpn. J. of Apl. Phys.*, vol. 30, No. 8A, Aug. 1991, pp. L1415-L1417.

Moon et al., "Growth of Crystalline $SrTiO_3$ Films on Si Substrates Using Thin Fluoride Buffer Layers and Their Electrical Properties," *Jpn. J. of Appl. Phys.*, vol. 33, (1994), pp. 5911-5916.

Farrow et al., "Heteroepitaxy of Dissimilar Materials," *Mat. Res. Soc. Symposium Proceedings*, vol. 221, pp. 29-34, Apr. 29-May 2, 1991.

Ishiwara et al., "Heteroepitaxy on Silicon: Fundamentals, Structure, and Devices," *Mat. Res. Soc.*, Symposium Proceedings, vol. 116, pp. 369-374, Apr. 5-8, 1988.

Douglas B. Chrisey, et al; Pulsed Laser Deposition of Thin Films; pp. 273-285.

B.A. Block, et al; "Photoluminescence properties of $Er^3$-doped $BaTiO_3$ thin films"; Appl. Phys. Lett. 65 (1), Jul. 4, 1994, pp. 25-27.

Kevin J. Chen et al; "A Novel Ultrafast Functional Device: Resonant Tunneling High Electron Mobility Transistor"; Electron Devices Meetingk 1996; IEEE Hong Kong; Jun. 29, 1996; pp. 60-63, XP010210167.

Wenhua Zhu et al.; "Molecular Beam Epitaxy of GaAs on Si-on-Insulator"; 320 Applied Physics Letters 59(1991) Jul. 8 No. 2; pp. 210-212.

Umesh K. Mishra et al; "Oxide Based Compound Semiconductor Electronics"; Electron Devices Meeting; 1997; Technical Digest, International; Washington, D.C.; Dec. 7-10, 1997; pp. 545-548.

J.M. Daughton et al.; "Applications of Spin Dependent Transport Materials"; J. Phys. D. Appl. Phys. 32(1999) R169-R177.

Wei Zhang et al.; "Stress Effect and Enhanced Magnetoresistance in $La_{0.67}Ca_{0.33}MnO_{3-\delta}$Films"; Physical Review, B. Condensed Matter; American Institute of Physics; vol. 58, No. 21, Part 1; Dec. 1, 1998; pp. 14143-14146.

Q.-Y. Tong et al.; "IOS—a new type of materials combination for system-on-a chip preparation"; 1999 IEEE International SOI Conference, Oct. 1999; pp. 104-105.

T. Kanniainen et al.; "Growth of Dielectric 1hfo2/Ta205 Thin Film Nanolaminate Capacitors By Atomic Layer Epitaxy"; Electrochemical Society Proceedings, U.S. Electrochemical Society; Pennington, N.J.; Aug. 31, 1997; pp. 36-46.

Myung Bok Lee; "Heteroepitaxial Growth of $BaTio_3$ Films on Si by Pulsed Laser Deposition"; Applied Physics Letters; Mar. 13, 1995; pp. 1331-1333.

Myung Bok Lee; "Formation and Characterization of Eptiaxial $TiO_2$ and $BaTiO_3/TiO_2$ Films on Si Substrate"; Japan Journal Applied Physics Letters; vol. 34; 1995; pp. 808-811.

Gilbert Lecarpentier et al.; "High Accuracy Machine Automated Assembly for Opto Electronics"; 2000 Electronic Components and Technology Conference; pp. 1-4.

R. Ramesh; "Ferroelectric La-Sr-Co-O/Pb-Zr-Ti-O/La-Sr-Co-O Heterostructures on Silicon via Template Growth"; 320 Applied Physics Letters; 63(1993); Dec. 27; No. 26; pp. 3592-3594.

K. Eisenbeiser; "Field Effect Transistors with $SrTiO_3$ Gate Dielectric on Si"; Applied Physics Letters; vol. 76, No. 10; Mar. 6, 2000; pp. 1324-1326.

Stephen A. Mass; "Microwave Mixers"; Second Edition; 2pp.

Douglas J. Hamilton et al.; "Basic Integrated Circuit Engineering"; pp. 2; 1975.

Takeshi Obata; "Tunneling Magnetoresistance at Up to 270 K in $La_{0.8}Sr_{0.2}MnO_3/SrTiO_3/La_{0.8}Sr_{0.2}MnO_3$ Junctions with 1.6-nm-Thick Barriers"; Applied Physics Letters; vol. 74, No. 2; Jan. 11, 1999; pp. 290-292.

Wei Zhang et al.; "Enhanced Magnetoresistance in La-Ca-Mn-O Films on Si Substrates Using $YbaCuO/CeO_2$ Heterostructures"; Physica C; vol. 282-287, No. 2003; Aug. 1, 1997; pp. 1231-1232.

Shogo Imada et al; "Epitaxial Growth of Ferroelectric $YmnO_3$ Thin Films on Si (111) Substrates by Molecular Beam Epitaxy"; Jpn. J. Appl. Phys. vol. 37 (1998); pp. 6497-6501; Part 1, No. 12A, Dec. 1998.

Ladislav Pust et al.; "Temperature Dependence of the Magnetization Reversal in Co(fcc)-BN-Co(poly hcp) Structures"; Journal of Applied Physics; vol. 85, No. 8; Apr. 15, 1999; pp. 5765-5767.

C. Martinez; "Epitaxial Metallic Nanostructures on GaAs"; Surface Science; vol. 482-485; pp. 910-915; 2001.

Wen-Ching Shih et al.; "Theoretical Investigation of the SAW Properties of Ferroelectric Film Composite Structures"; IEEE Transactions of Ultrasonics, Ferroelectrics, and Frequency Control; vol. 45, No. 2; Mar. 1998; pp. 305-316.

Zhu Dazhong et al.; "Design of $ZnO/SiO_2/Si$ Monolithic Integrated Programmable SAW Filter"; Proceedings of Fifth International Conference on Solid-State and Integrated Circuit Technology; Oct. 21-23, 1998; pp. 826-829.

Kirk-Othmer Encyclopedia of Chemical Technology; Fourth Edition, vol. 12; Fuel Resources to Heat Stabilizers; A Wiley-Interscience Publication; John Wiley & Sons.

Joseph W. Goodman et al; "Optical Interconnections For VLSI Systems"; Proceedings of the IEEE, vol. 72, No. 7 Jul. 1984.

Fathimulla et al.; "Monolithic Integration of InGaAs/InAlAs MODFETs and RTDs on InP-bonded-to Si Substrate"; Fourth International Conference on Indium Phosphide and Related Materials, Newport, RI, USA; Apr. 21-24, 1992 ; pp. 167-170; XP000341253; IEEE, New York, NY, USA; ISBN: 0-7803-0522-1.

H. Takahashi et al.; "Arraryed-Waveguide Grating For Wavelength Division Multi/Demultiplexer With Nanometre REsolution"; Electronics Letters; vol. 26., No. 2, Jan. 18, 1990.

Pierret, R.F.; "1/J-FET and MESFET"; Field Effect Devices; MA, Addison-Wesley; 1990; pp. 9-22.

M. Schreiter, et al.; "Sputtering of Self-Polarized PZT Films for IR-Detector Arrays"; 1998 IEEE; pp. 181-185.

Hideaki Adachi et al.; "Sputtering Preparation of Ferroelectric PLZT Thin Films and Their Optical Applications"; IEEE Transactions of Ultrasonics, Ferroelectrics and Frequency Control, vol. 38, No. 6, Nov. 1991.

A.J. Moulson et al.; "Electroceramics Materials Properties Applications"; Chapman & Hall; pp. 366-369.

P.A. Langjahr et al.; "Epitaxial Growth and Structure of Cubic and Pseudocubic Perovskite Films on Perovskite Substrates"; Mat. Res. Soc. Symp. Proc., vol. 401; 1995 Materials Research Society; pp. 109-114.

Wang et al.; "Depletion-Mode GaAs MOSFETs with Negligible Drain Current Drift and Hysteresis"; Electron Devices Meeting, 1998, IEDM '98 Technical Digest; pp. 67-70.

Ben G. Streetman; "Solid State Electronic Devices"; 1990, Prentice Hall; Third Edition; pp. 320-322.

A.Y Wu et al.; "Highly Oriented $(Pb,La)(Zr,Ti)O_3$ Thin Films on Amorphous Substrates"; IEEE, 1992; pp. 301-304.

Timothy E. Glassman et al.; "Evidence for Cooperative Oxidation of MoCVD Precursors Used in $Ba_xSr_{1-x}TiO_3$ Film Growth"; Mat. Res. Soc. Symp. Proc. vol. 446, 1997 Materials Research Society; pp. 321-326.

S.N. Subbarao et al.; "Monolithic PIN Photodetector and FET Amplifier on GaAs-0s-Si"; IEEE; GaAs IC Symposium-163-166; 1989.

T.A. Langdo et al.; "High Quality Ge on Si by Epitaxial Necking"; Applied Physics Letters; vol. 76, No. 25; pp. 3700-3702; Jun. 19, 2000.

Chenning Hu et al.; Solar Cells From Basics to Advanced Systems; McGraw-Hill Book Company; 1983.

O.J. Painter et al; "Room Temperature Photonic Crystal Defect Lasers at Near-Infrared Wavelengths in InGaAsp"; Journal of Lightwave Technology, vol. 17, No. 11; Nov. 1999.

C. Donn et al.; "A 16-Element, K-Band Monolithic Active Receive Phased Array Antenna"; Antennas and Propagation Society International Symposium, 1988; pp. 188-191, vol. 1; Jun. 6-10, 1988.

Don W. Shaw; "Epitaxial GaAs on Si: Progress and Potential Applications"; Mat. Res. Soc. Symp. Proc.; pp. 15-30; 1987.

G.J.M. Dormans, et al.; "$PbTiO/_3$/Thin Films Grown by

Organometallic Chemical Vapour Deposition"; Third International Symposium on Integrated Ferroelectrics; Apr. 3-5, 1991 (Abstract).

P.J. Borrelli et al.; "Compositional and Structural Properties of Sputtered PLZT Thin Films"; Ferroelectric Thin Films II Symposium; Dec. 2-4, 1991 (Abstract).

Ranu Nayak et al; "Enhanced acousto-optic diffraction efficiency in a symmetric SrRiO3/BaTiO3/SrTiO3 thin-film heterostructure"; Nov. 1, 2000; vol. 39, No. 31; Applied Optics; pp. 5847-5853.

Ranu Nayak et al; "Studies on acousto-optical interaction in SrTiO3/BaTiO3/SrTiO3 epitaxial thin film heterostructures"; J. Phys. D: Appl. Phys. 32 (1999) 380-387.

S.K. Tewksbury et al.; "Cointegration of Optoelectronics and Submicron CMOS"; Wafer Scale Integration; 1993; Proceedings, Fifth Annual IEEE; Jan. 20, 1993; pp. 358-367.

V. Kaushik et al.; "Device Characteristics of Crystalline Epitaxial Oxides on Silicon"; Device Research Conference, 2000; Conference Digest 58th DRC; pp. 17-20; Jun. 19-21, 2000.

Katherine Derbyshire; "Prospects Bright for Optoelectronics Volume, Cost Drive Manufacturing for Optical Applications"; Semiconductor Magazine; vol. 3, No. 3; Mar. 2002.

Alex Chediak et al; "Integration of GaAs/Si with Buffer Layers and Its Impact on Device Integration"; TICS 4, Prof. Sands. MSE 225, Apr. 12, 2002; pp. 1-5.

S.A. Chambers et al; "Band Discontinuities at Epitaxial SrTiO3/Si(001) Heterojunctions"; Applied Physics Letters; vol. 77, No. 11; Sep. 11, 2000; pp. 1662-1664.

H. Wang et al.; "GaAs/GaAlAs Power HBTs for Mobile Communications"; Microwave Symposium Digest; 1993 IEEE; vol. 2.; pp. 549-552.

Y. Ota et al.; "Application of Heterojunction FET to Power Amplifier for Cellular Telephone"; Electronics Letters; May 26, 1994; vol. 30, No. 11; pp. 906-907.

Keiichi Sakuno et al; "A 3.5W HBT MMIC Power Amplifier Module for Mobile Communications"; IEEE 1994; Microwave and Millimeter-Wave Monolithic Circuits Symposium; pp. 63-66.

Mitsubishi Semiconductors Press Release (GaAs FET's) Nov. 8, 1999 pp. 1-2.

R.J. Matyi et al; "Selected Area Heteroepitaxial Growth of GaAs on Silicon for Advanced Device Structures"; 2194 Thin Solid Films; 181 (1989) Dec. 10; No. 1; pp. 213-225.

K. Nashimoto et al; "Patterning of Nb, LaOnZr, TiO3 Waveguides for Fabricating Micro-Optics Using Wet Etching and Solid-Phase Epitaxy"; Applied Physics Letters; vol. 75, No. 8; Aug. 23, 1999; pp. 1054-1056.

Bang-Hung Tsao et al; "Sputtered Barium Titanate and Barium Strontium Titanate Films for Capacitor Applications"; Applications of Ferroelectrics, 2000; Proceedings of the 2000 12th International Symposium on vol. 2; pp. 837-840.

Man Fai Ng et al; "Heteroepitaxial growth of lanthanum aluminate films derived from mixed metal nitrates"; Journal of Materials Research; vol. 12, No. 5; pp. 1306.

Yuji Matsumoto et al.; "Room-Temperature Ferromagnetism in Transparent Transition Metal-Doped Titanium Dioxide"; Science; Feb. 2, 2001; vol. 291; pp. 854-856.

S.A. Chambers et al.; "Epitaxial Growth and Properties of Ferromagnetic Co-Doped TiO2 Anatase"; Applied Physics Letters; vol. 79, No. 21; Nov. 19, 2001; pp. 3467-3469.

* cited by examiner

SEMICONDUCTOR STRUCTURE EXHIBITING REDUCED LEAKAGE CURRENT AND METHOD OF FABRICATING SAME

FIELD OF THE INVENTION

This invention relates generally to semiconductor structures and devices and to a method for their fabrication, and more specifically to fabrication of semiconductor structures, devices, and integrated circuits that include an epitaxially grown, high dielectric constant strained-layer heterostructure to reduce leakage current.

BACKGROUND OF THE INVENTION

The search for alternative gate oxide materials has become more vigorous as complementary metal-oxide-semiconductor (CMOS) technology using $SiO_2$ as the gate oxide approaches its fundamental limits. Currently, it is not possible to use $SiO_2$ layers on Si at the thickness required to achieve the next desired level of performance (approximately 10 angstroms) without unacceptably high gate leakage current. Utilizing oxides with dielectric constants greater than that of $SiO_2$ permits larger gate oxide thickness with the same capacitance. However, in addition to a high dielectric constant, the high dielectric constant oxide should exhibit sufficiently large energy band offsets at the interface with Si so that Schottky leakage current is negligible.

Several oxides have been investigated as potential candidates to replace $SiO_2$. One of the most promising thus far is perovskite oxides, such as $SrTiO_3$ ("STO"). These oxides have a high bulk dielectric constant and exhibit a high degree of structural compatibility with Si, making epitaxy possible. It has been demonstrated that single-crystal $SrTiO_3$ thin films can be grown on Si(001) substrates by molecular beam epitaxy (MBE) with interface state densities as low as $6 \times 10^{10}$ states/$cm^2$. See, e.g., R. A. McKee et al, *Phys. Rev. Lett.* 81, p. 3014 (1998) and K. Eisenbeiser et al., *Appl. Phys. Lett.* 76, p. 1324 (2000). The equivalent dielectric layer thickness of $SrTiO_3$ may be more than ten times less than that of $SiO_2$. Thus, the gate oxide layer thickness can be ten times larger when $SiO_2$ is replaced with $SrTiO_3$, and yet the capacitance can be approximately the same.

Although the $SrTiO_3$/Si structure demonstrates these promising properties, theoretical and experimental evidence indicates that the structure may exhibit significant Schottky electron leakage current. See, e.g., J. Robertson and C. W. Chen, *Appl. Phys. Lett.* 74, p 1168 (1999) and S. A. Chambers et al., *Appl Phys. Lett.* 77, p. 1662 (2000), herein incorporated by reference. Referring to FIGS. 1 and 2, the $SrTiO_3$/Si structure exhibits a much smaller conduction band offset ($\Delta E_{c1}$) compared to the valence band offset ($\Delta E_{v1}$) for both n-Si and p-Si structures and, hence, almost the entire band discontinuity resides at the valance band edge. Accordingly, Schottky leakage current may result. It would be desirable to engineer the energy band offset such that appropriate height Schottky barriers exist at both conduction and valence band edges.

Accordingly, a need exists for a semiconductor structure having a gate oxide formed of a high dielectric constant which exhibits low Schottky electron leakage current.

In addition, a need exists for a method of changing the energy band offset at the interface of two crystalline materials to reduce Schottky leakage current.

A need further exists for a method of changing the energy band offset at the interface of two crystalline materials to accommodate specific device applications.

BRIEF DESCRIPTION OF THE DRAWINGS

The present invention is illustrated by way of example and not limitation in the accompanying figures, in which like references indicate similar elements, and in which.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

The present invention provides a method of fabricating a high dielectric constant crystalline oxide layer on a semiconductor substrate using a crystalline high dielectric constant strained-layer heterostructure. In one aspect of the invention, the strained-layer heterostructure is formed of a first high dielectric constant crystalline oxide layer underlying a second crystalline oxide layer which has a lattice constant different from the first. The difference in lattice constants between the two layers may create strain within the oxide layers of the heterostructure, at the interface between the oxide layers of the heterostructure and at the interface of the substrate and the heterostructure which result in creation of a suitable Schottky barrier at the semiconductor substrate/heterostructure interface.

Figure 3:
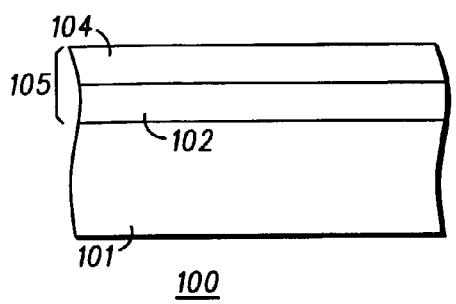
FIGS. 3 and 4 illustrate schematically, in cross section, device structures in accordance with various embodiments of the invention.

FIG. 3 illustrates schematically, in cross section, a structure 100 in accordance with an exemplary embodiment of the present invention. Structure 100 may be a device such as, for example, a component of a MOS device or any high dielectric constant device. Structure 100 includes a substrate 101, which may be formed of a monocrystalline semiconductor material, such as, for example, silicon (Si), strontium-passivated Si, germanium (Ge), silicon germanium (Si—Ge), indium phosphide (InP), or gallium arsenide (GaAs). Substrate 101 may also comprise a suitable compound semiconductor material, such as, for example, indium gallium arsenide (InGaAs), indium aluminum arsenide (InAlAs), aluminum gallium arsenide (AlGaAs), indium gallium phosphide (InGaP), and other compound semiconductor materials known to those skilled in the art to be suitable for particular semiconductor device applications. In one embodiment, substrate 101 comprises a monocrystalline n-type silicon substrate. Substrate 101 may optionally include a plurality of material layers such that the composite substrate may be tailored to the quality, performance, and manufacturing requirements of a variety of semiconductor device applications.

In another embodiment of the invention, substrate 101 may comprise a (001) Group IV material that has been off-cut towards a (110) direction. The growth of materials on a miscut Si (001) substrate is known in the art. For example, U.S. Pat. No. 6,039,803, issued to Fitzgerald et al. on Mar. 21, 2000, which patent is herein incorporated by reference, is directed to growth of silicon-germanium and germanium layers on miscut Si (001) substrates. Substrate 101 may be off-cut in the range of from about 2 degrees to about 6 degrees towards the (110) direction. A miscut Group IV substrate reduces dislocations and results in improved quality of a subsequently grown monocrystalline material layers.

A monocrystalline oxide interface layer 102 is formed overlying substrate 101. Monocrystalline oxide interface layer 102 may comprise a monocrystalline oxide material selected for its crystalline (i.e., lattice) compatibility with the underlying substrate. For example, the material could be an oxide or nitride having a lattice structure closely matched to the substrate. Materials that are suitable for the monocrystalline oxide interface layer 102 include metal oxides such as the alkaline earth metal titanates, alkaline earth metal zirconates, alkaline earth metal hafnates, alkaline earth metal tantalates, alkaline earth metal ruthenates, alkaline earth metal niobates, alkaline earth metal vanadates, perovskite oxides such as alkaline earth metal tin-based perovskites, lanthanum aluminate, lanthanum scandium oxide and gadolinium oxide. In an exemplary embodiment, layer 102 may comprise an alkaline earth metal titanate, such as, for example, barium titanate ($BaTiO_3$), strontium titanate ($SrTiO_3$), or barium strontium titanate ($Sr_zBa_{1-z}TiO_3$), or another suitable oxide material having a thickness of up to about 100 angstroms. Preferably, monocrystalline oxide interface layer 102 is formed of $SrTiO_3$ having a thickness in the range of approximately 1–5 nm.

Figure 4:
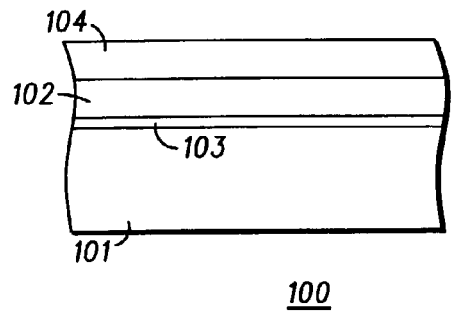

In accordance with another embodiment of the invention, as shown in FIG. 4, structure 100 may also include an amorphous intermediate layer 103 positioned between substrate 101 and monocrystalline oxide interface layer 102. In accordance with one embodiment of the invention, amorphous intermediate layer 103 is grown on substrate 101 at the interface between substrate 101 and the growing monocrystalline oxide interface layer 102 by the controlled oxidation of substrate 101 during the growth of layer 102. The amorphous intermediate layer typically does not affect the band discontinuity at the interface of the substrate 101 layer and the monocrystalline oxide interface layer 102.

Referring again to FIG. 3, a monocrystalline oxide straining layer 104 is formed overlying monocrystalline oxide interface layer 102 to form a strained-layer heterostructure 105. Layer 104 may have a thickness of from approximately one monolayer up to about 100 angstroms. Monocrystalline oxide straining layer 104 may be formed of any of those compounds previously described with reference to layer 102 in FIGS. 3 and 4 and having a crystalline lattice constant that is different than the lattice constant of layer 102. As used herein, lattice constant refers to the distance between atoms of a unit cell measured in the plane of a surface. For example, if monocrystalline oxide interface layer 102 is formed of $Sr_xBa_{1-x}TiO_3$ where $0 \leq x \leq 1$, monocrystalline oxide straining layer 104 may comprise $Sr_yBa_{1-y}TiO_3$, where y does not equal x, which has a different lattice constant than $Sr_xBa_{1-x}TiO_3$. The difference in lattice constants results in strain within layers 102 and 104, at the interface between layers 102 and 104, and at the interface of substrate 101 and heterostructure 105. The strain results in an increase of the conduction band offset at the interface of substrate 101 and monocrystalline oxide interface layer 102, effecting an increase of the Schottky barrier at the interface. The strain also results in a change of the valence band offset at the interface. Preferably, if layer 102 is formed of $SrTiO_3$, layer 104 is formed of $BaTiO_3$ having a thickness in the range of from 1 to 5 nm.

The following example illustrates a process, in accordance with one embodiment of the invention, for fabricating a semiconductor structure having a low leakage current density.

The process starts by providing a monocrystalline semiconductor substrate comprising, for example, silicon and/or germanium. In accordance with one embodiment of the invention, the semiconductor substrate is a Sr-passivated silicon wafer having a (001) orientation. The substrate is preferably oriented on axis or, at most, about 2° to about 6° off axis. At least a portion of the semiconductor substrate has a bare surface although other portions of the substrate may encompass other structures. The term "bare" in this context means that the surface in the portion of the substrate has been cleaned to remove any oxides, contaminants, or other foreign material. As is well known, bare silicon is highly reactive and readily forms a native oxide. The term "bare" is intended to encompass such a native oxide. A thin silicon oxide may also be intentionally grown on the semiconductor substrate, although such a grown oxide is not essential to the process in accordance with the invention. To epitaxially grow a monocrystalline oxide layer overlying the monocrystalline substrate, the native oxide layer must first be removed to expose the crystalline structure of the underlying substrate. The following process is preferably carried out by molecular beam epitaxy (MBE), although other epitaxial processes may also be used in accordance with the present invention. The native oxide can be removed by first thermally depositing a thin layer of strontium, barium, or combination of strontium and barium or other alkali earth metals or combinations of alkali earth metals in an MBE apparatus. In the case where strontium is used, the substrate is then heated to a temperature of about 750° C. to cause the strontium to react with the native silicon oxide layer. The strontium serves to reduce the silicon oxide to leave a silicon oxide-free surface. The resultant surface exhibits an ordered 2×1 structure. If an ordered 2×1 structure has not been achieved at this stage of the process, the structure may be exposed to additional strontium until an ordered 2×1 structure is obtained. The ordered 2×1 structure forms a template for the ordered growth of an overlying layer of a monocrystalline oxide. The template provides the necessary chemical and physical properties to nucleate the crystalline growth of an overlying layer.

In accordance with an alternate embodiment of the invention, the native silicon oxide can be converted and the substrate surface can be prepared for the growth of a monocrystalline oxide layer by depositing an alkaline earth metal oxide, such a strontium oxide, strontium barium oxide, or barium oxide, onto the substrate surface by MBE at a low temperature and by subsequently heating the structure to a temperature of about 750° C. At this temperature a solid state reaction takes place between the strontium oxide and the native silicon oxide causing the reduction of the native silicon oxide and leaving an ordered 2×1 structure with strontium, oxygen, and silicon remaining on the substrate surface. Again, this forms a template for the subsequent growth of an ordered monocrystalline oxide layer.

Following the removal of the silicon oxide from the surface of the substrate, in accordance with one embodiment of the invention, the substrate is cooled to a temperature in the range of about 200–800° C. and a thin layer of strontium titanate is grown on the template layer by molecular beam epitaxy. The MBE process is initiated by opening shutters in the MBE apparatus to expose strontium, titanium and oxygen sources. The ratio of strontium and titanium is approximately 1:1. The partial pressure of oxygen is initially set a minimum value to grow stoichiometric strontium titanate at a growth rate of about 0.3–0.5 nm per minute. After initiating growth of the strontium titanate, the partial pressure of oxygen is increased above the initial minimum value. The partial pressure of oxygen may cause the growth of an amorphous silicon oxide layer at the interface between the underlying substrate and the growing strontium titanate layer. The growth of the silicon oxide layer results from the diffusion of oxygen through the growing strontium titanate layer to the interface where the oxygen reacts with silicon at the surface of the underlying substrate. The thickness of the amorphous silicon oxide layer can be controlled by varying the temperature of the process and the oxygen partial pressure. The thickness of the amorphous silicon oxide layer may be as thick as 1 nm but is preferably within the range of about 0.2 nm to about 0.7 nm. The strontium titanate grows as an ordered monocrystal with the crystalline orientation rotated by 45° with respect to the unit cell of the underlying substrate.

After the strontium titanate layer has been grown to the desired thickness, preferably from a few monolayers up to approximately 100 angstroms, a thin layer of barium titanate is grown overlying the strontium titanate layer by molecular beam epitaxy. The barium titanate layer is preferably grown to a thickness of from about a few monolayers to about 100 angstroms.

The process described above illustrates a process for forming a semiconductor structure including a silicon substrate and an overlying strained-layer heterostructure by the process of molecular beam epitaxy. The process can also be carried out by the process of chemical vapor deposition (CVD), metal organic chemical vapor deposition (MOCVD), migration enhanced epitaxy (MEE), atomic layer epitaxy (ALE), physical vapor deposition (PVD), chemical solution deposition (CSD), pulsed laser deposition (PLD), or the like. Further, by a similar process, other monocrystalline layers such as alkaline earth metal titanates, zirconates, hafnates, tantalates, vanadates, ruthenates, and niobates, perovskite oxides such as alkaline earth metal tin-based perovskite, lanthanum aluminate, lanthanum scandium oxide, and gadolinium oxide can also be grown.

Figure 1:
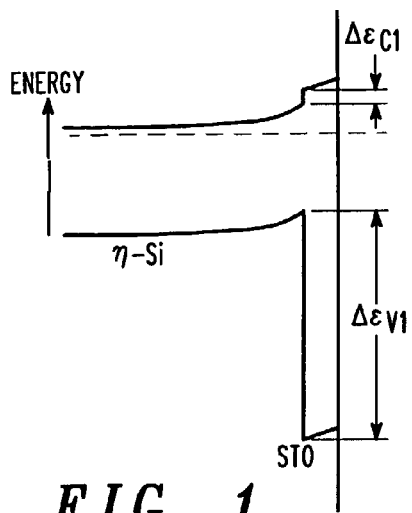
FIG. 1 is a graphical representation of an energy band diagram of a $SrTiO_3$/n-Si structure.
Figure 2:
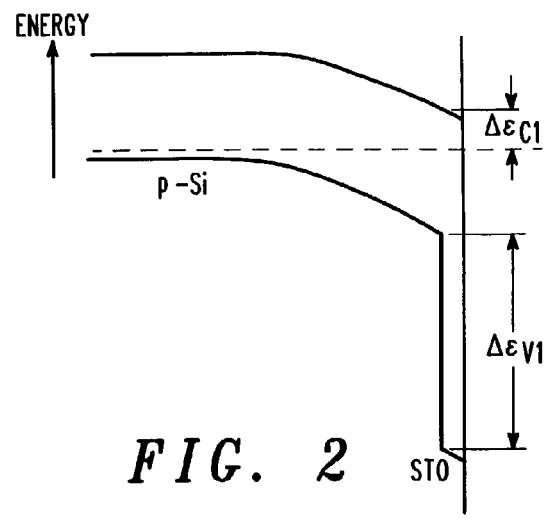
FIG. 2 is a graphical representation of an energy band diagram of a $SrTiO_3$/p-Si structure.
Figure 5:
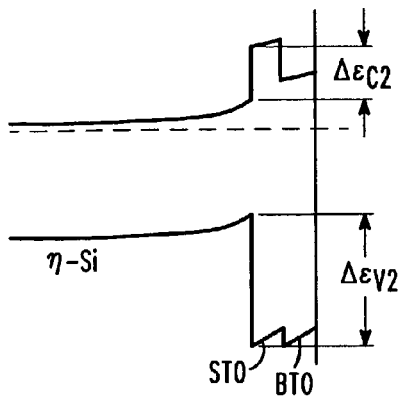
FIG. 5 is a graphical representation of an energy band diagram of a device structure in accordance with an embodiment of the invention.

An illustration of an energy band diagram of an exemplary embodiment of structure 100 wherein substrate 101 is formed of n-Si, monocrystalline oxide transition layer 102 is formed of SrTiO$_3$ (STO) and monocrystalline oxide straining layer 104 is formed BaTiO$_3$ (BTO) is shown in FIG. 5. As illustrated, the conduction band offset at the Si/STO interface ($\Delta E_{c2}$) of structure 100 is greater than the conduction band offset at the Si/STO interface of the structure illustrated in FIG. 1, that is, $\Delta E_{c2} > \Delta E_{c1}$. Similarly, the valence band ($\Delta E_{v2}$) offset at the Si/STO interface of structure 100 is smaller than the valence band offset at the Si/STO interface of the structure illustrated in FIG. 1, that is, $\Delta E_{v2} < \Delta E_{v1}$.

EXAMPLE

In this example, a monocrystalline semiconductor substrate of n-silicon having a (001) orientation was provided. Native oxide was removed by first thermally depositing a thin layer of strontium in an MBE apparatus. The substrate was heated to a temperature of about 750° C. to cause the strontium to react with the native silicon oxide layer. The resultant surface exhibited an ordered 2×1 structure.

Following the removal of the silicon oxide from the surface of the substrate, the substrate was cooled to a temperature in the range of about 200–800° C. and a thin layer of approximately 2 nm of strontium titanate was grown on the template layer by MBE. The MBE process was initiated by opening shutters in the MBE apparatus to expose strontium, titanium and oxygen sources. The ratio of strontium and titanium was approximately 1:1.

After the strontium titanate layer was grown on the substrate, a thin layer of approximately 2 nm of barium titanate was deposited on the strontium titanate layer using MBE at a temperature in the range of 200–800° C. Deposition of the barium titanate layer formed a BTO/STO strained-layer heterostructure on Si.

The BTO/STO/Si structure was then measured using x-ray photoemission spectroscopy (XPS). XPS results from the BTO/STO/Si structure were compared to those of an STO/Si structure. The results showed an expansion of the conduction band offset at the Si/STO interface ($\Delta Ec$) from approximately 0.01 eV for the STO/Si structure to 0.9 eV for the BTO/STO/Si structure. The valence band offset at the Si/STO interface ($\Delta Ev$) showed a shift from –2.12 eV for the STO/Si structure to –1.27 eV for the BTO/STO/Si structure. The more balanced bandgap of the BTO/STO/Si indicates that this structure would exhibit decreased Schottky leakage current compared to the STO/Si structure.

In yet a further embodiment of the invention, heterostructure 105 may include a second monocrystalline oxide straining layer (not shown) overlying monocrystalline oxide straining layer 104. This second monocrystalline oxide straining layer may be formed of any of those compounds previously described with reference to layers 102 and 104 in FIGS. 3 and 4. The second monocrystalline oxide straining layer has a crystalline lattice constant which is different from the lattice constant of layer 104 and which may be the same as, or alternatively different from, layer 102. By the addition of the second monocrystalline oxide straining layer, the offset of the conduction band and valence band at the interface of the substrate and layer 102 may be tailored to the Schottky barrier requirements of a variety of semiconductor device applications. In a similar manner, a third monocrystalline oxide straining layer or more monocrystalline oxide straining layers may be formed overlying the second monocrystalline oxide straining layer to further tailor the conduction band and valence band offsets.

Figure 6:
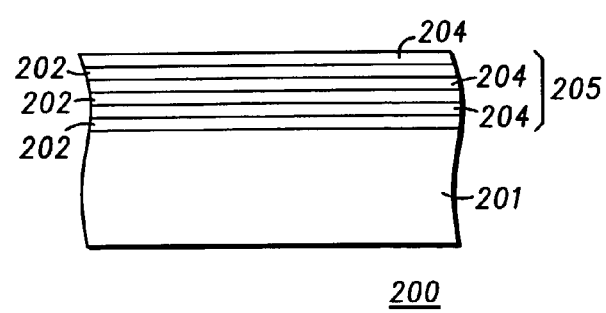
FIG. 6 illustrates schematically, in cross section, a device structure in accordance with another embodiment of the invention.

FIG. 6 illustrates schematically, in cross section, a semiconductor device structure 200 fabricated in accordance with a further alternative embodiment of the present invention, wherein semiconductor device structure 200 comprises a component of an MOS device. Structure 200 includes a monocrystalline semiconductor substrate 201. Monocrystalline semiconductor substrate 201 may be formed of a monocrystalline material such as that comprising layer 101 with reference to FIG. 3. Structure 200 also has a plurality of first monocrystalline oxide straining layers 202 alternating between a plurality of second monocrystalline oxide straining layers 204 which form a strained-layer heterostructure 205. First monocrystalline oxide straining layers 202 may comprise a monocrystalline oxide material selected for its crystalline (i.e., lattice) compatibility with the underlying substrate and having a first lattice constant. First monocrystalline oxide straining layers 202 may be formed of any of those compounds previously described with reference to layer 102 in FIGS. 3 and 4. In an exemplary embodiment, layer 202 may comprise an alkaline earth metal titanate, such as, for example, barium titanate (BaTiO$_3$), strontium titanate (SrTiO$_3$), barium strontium titanate (Sr$_z$Ba$_{1-z}$TiO$_3$), or another suitable oxide material. Second monocrystalline oxide straining layers 204 may be formed of any of those compounds previously described with reference to layer 104 in FIGS. 3 and 4 with a lattice constant that is different from first monocrystalline oxide straining layers 202. For example, if first monocrystalline oxide straining layers 202 are formed of SrTiO$_3$, second monocrystalline oxide straining layers may be formed of BaTiO$_3$, which has a larger crystalline lattice constant that SrTiO$_3$. In one embodiment, layers 202 are layers of SrTiO$_3$ having a thickness of up to about 20 angstroms and layers 204 are layers of BaTiO$_3$ having a thickness of up to 20 angstroms.

It will be appreciated that the materials of first monocrystalline oxide straining layers 202 and second monocrystalline oxide straining layers 204 may be selected to tailor the conductive and valence energy band offsets at the interface of strained-layer heterostructure 205 and the underlying substrate to achieve the quality and performance requirements of a variety of semiconductor device applications. For example, second monocrystalline oxide straining layers 204 may be formed of material having a crystalline lattice constant that is less than the crystalline lattice constant of first monocrystalline oxide straining layers 202.

Alternatively, it will be appreciated that the strained heterostructure overlying the substrate may be formed of any number of layers, wherein each layer has a lattice constant which differs from and/or corresponds to the lattice constants of any of the other layers. The materials of the layers may be selected to produce a desired amount of strain at the interface of the heterostructure and the substrate to engineer the conductive and valence energy band offsets so that Schottky leakage current may be increased or decreased according to the requirements of desired semiconductor device application.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, solution to occur or become more pronounced are not to be constructed as critical, required, or essential features or elements of any or all of the claims. As used, herein, the terms "comprises," "comprising" or any other variation thereof, are intended to cover a non-exclusive inclusion, such that a process, method, article, or apparatus that comprises a list of elements does not include only those elements but may include other elements not expressly listed or inherent to such process, method, article, or apparatus.

We claim:

1. A semiconductor structure exhibiting reduced leakage current comprising:
    a monocrystalline silicon substrate;
    an amorphous oxide material in contact with the monocrystalline silicon substrate; and
    a strained-layer heterostructure overlying said substrate, said heterostructure having:
        a first layer comprising a first monocrystalline oxide material having a first lattice constant selected from the group consisting of alkaline earth metal titanates, alkaline earth metal zirconates, alkaline earth metal hafnates, alkaline earth metal tantalates, alkaline earth metal ruthenates, alkaline earth metal niobates, alkaline earth metal vanadates, alkaline earth metal tin-based perovskites, lanthanum aluminate, lanthanum scandium oxide, gadolinium oxide and mixtures thereof contacting the amorphous oxide material; and
        a second layer comprising a second monocrystalline oxide material overlying said first layer and having a second lattice constant, wherein said second lattice constant is different from said first lattice constant,
    wherein a strain is effected at least at one of an interface of said strained layer heterostructure and said substrate, an interface between said first layer and said second layer, and within said first layer and said second layer, and
    wherein said substrate comprises a (001) semiconductor material having an orientation from about 2 degrees to about 6 degrees offset toward the (110) direction.

2. The semiconductor structure of claim 1, wherein said strained-layer heterostructure further comprises alternating first strained layers and second strained layers, wherein said alternating first and second strained layers overlie said second layer, and wherein said first strained layers comprise said first monocrystalline oxide material and said second strained layers comprise said second monocrystalline oxide material.

3. The semiconductor structure of claim 1, wherein said first layer has a thickness ranging from approximately one monolayer to approximately 100 angstroms.

4. The semiconductor structure of claim 1, wherein said second layer has a thickness ranging from approximately one monolayer to approximately 100 angstroms.

5. The semiconductor structure of claim 1, wherein said second lattice constant is greater than said first lattice constant.

6. The semiconductor structure of claim 1, wherein said first layer comprises $Sr_xBa_{1-x}TiO_3$, wherein x ranges from 0 to 1.

7. The semiconductor structure of claim 6, wherein said second layer comprises $Sr_yBa_{1-y}TiO_3$, where y is not equal to x.

8. The semiconductor structure of claim 1, wherein said second layer comprises a monocrystalline oxide material selected from the group consisting of alkaline earth metal titanates, alkaline earth metal zirconates, alkaline earth metal haihates, alkaline earth metal tantalates, alkaline earth metal ruthenates, alkaline earth metal niobates, alkaline earth metal vanadates, perovskite oxides such as alkaline earth metal tin-based perovskites, lanthanum aluminate, lanthanum scandium oxide, and gadolinium oxide.

9. The semiconductor structure of 1, wherein said strained-layer heterostructure further comprises a third layer formed of monocrystalline oxide material overlying said second layer and having a third lattice constant, wherein said third lattice constant is different from said second lattice constant.

10. The semiconductor structure of claim 9, wherein said third lattice constant is approximately equal to said first lattice constant.

11. The semiconductor structure of claim 9, wherein said third lattice constant is greater than said second lattice constant.

* * * * *